(12) United States Patent
Gan et al.

(10) Patent No.: US 8,068,797 B2
(45) Date of Patent: Nov. 29, 2011

(54) GAIN CONTROL METHODS FOR WIRELESS DEVICES AND TRANSMITTERS

(75) Inventors: Jiangbo Gan, Gilbert, AZ (US); Srinivasa R. Bommareddy, Gilbert, AZ (US); Pravin Premakanthan, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 660 days.

(21) Appl. No.: 12/249,649

(22) Filed: Oct. 10, 2008

(65) Prior Publication Data

US 2009/0088102 A1 Apr. 2, 2009

Related U.S. Application Data

(63) Continuation-in-part of application No. 11/864,519, filed on Sep. 28, 2007, now Pat. No. 7,805,116.

(51) Int. Cl.
*H04B 1/04* (2006.01)
*H04K 3/00* (2006.01)

(52) U.S. Cl. .................. 455/114.3; 455/126; 455/127.1; 375/296

(58) Field of Classification Search ............... 455/114.3, 455/126, 127.1–127.2; 375/296, 297
See application file for complete search history.

(56) References Cited

U.S. PATENT DOCUMENTS

| | | | |
|---|---|---|---|
| 6,160,449 A * | 12/2000 | Klomsdorf et al. | ........... 330/149 |
| 6,751,444 B1 | 6/2004 | Meiyappan | |
| 7,148,749 B2 | 12/2006 | Rahman et al. | |
| 7,215,972 B2 | 5/2007 | Premakanthan et al. | |
| 7,346,317 B2 | 3/2008 | Rahman et al. | |
| 7,577,408 B2 * | 8/2009 | Muller et al. | ............... 455/114.3 |
| 7,805,116 B2 * | 9/2010 | Xu et al. | ..................... 455/127.2 |
| 2006/0114075 A1 | 6/2006 | Janosevic et al. | |
| 2006/0223462 A1 | 10/2006 | Rahman et al. | |
| 2008/0074209 A1 | 3/2008 | Ceylan et al. | |
| 2009/0285330 A1 * | 11/2009 | Premakanthan et al. | ..... 375/297 |

OTHER PUBLICATIONS

Deng, J., et al., A Dual-band High Efficiency CMOS Transmitter for Wireless CDMA Application, IEEE Radio Frequency Integrated Circuits Symposium 2007.

* cited by examiner

*Primary Examiner* — Lee Nguyen
(74) *Attorney, Agent, or Firm* — Ingrassia Fisher & Lorenz, PC

(57) ABSTRACT

A gain control process (1102) executed at a transmitter (500) generates (1314) a gain ramp signal (1206) having a delay component (1224) and a gain component (1226). The process (1102) further generates (1304) and incorporates (1306) a gain arc (1202) into a digital signal to form a digital gain signal (1204) having a digital gain change (1218). A combiner (502) combines a digital input signal (512) with the digital gain signal (1204) to generate a pre-compensated digital signal (516). A variable gain amplifier (508) applies a sequence of gains (1234,1236,1238,1240,1242) in the gain component (1126) of the gain ramp signal (1206) to a pre-adjusted analog signal (520) in order to generate a gain-adjusted analog signal (524). Application of the gain component (1126) and the digital gain change (1218) occurs when a portion (1212) of the gain arc (1202) indicates a low instantaneous signal power at an antenna (106) in order to reduce ACLR degradation.

20 Claims, 14 Drawing Sheets

US 8,068,797 B2

GAIN CONTROL METHODS FOR WIRELESS DEVICES AND TRANSMITTERS

RELATED INVENTION

The present invention is a continuation in part (CIP) of "Gain Control Methods For Wireless Devices And Transmitters," U.S. patent application Ser. No. 11/864,519, filed 28 Sep. 2007, which is incorporated by reference herein.

TECHNICAL FIELD OF THE INVENTION

Embodiments of the inventive subject matter relate to gain control methods and apparatus for transmitted radio frequency (RF) signals, and more particularly to gain control methods, wireless devices, and transmitters adapted to adjust gains that are applied to a digital input signal prior to amplification and transmission.

BACKGROUND OF THE INVENTION

Transmitter designs for wireless devices typically are constrained to meet specific quality of service (QoS) requirements relating to certain measurable characteristics of transmitted radio frequency (RF) signals. These QoS requirements may be specified by various standards or manufacturer-imposed specifications. For example, a standard or specification may set forth not-to-exceed values for the adjacent- and/or alternate-channel leakage ratio (ACLR), block error rate (BLER), and/or bit error rate (BER), among other things. Manufacturer adherence to these standards and specifications helps to ensure high signal quality and end-user satisfaction.

RF transmitters for some types of wireless devices are designed to enable the transmitted signal power to be adjusted dynamically. For example, power control methods are implemented in RF transmitters for "third generation" (3G) wireless devices, such as a variety of 3G Wideband Code Division Multiple Access (W-CDMA) transmitters. In such transmitters, the signal gain dynamically is adjusted (i.e., increased and decreased) based on various factors, such as a comparison between the then-current, received signal to interference ratio (SIR) and a target SIR, for example. In order to implement the dynamic power control, a W-CDMA transmitter may include a variable gain amplifier (VGA), which receives a gain control signal that may cause the VGA to apply increased or decreased gains to an outgoing RF signal to produce a gain-adjusted RF signal. The gain-adjusted RF signal is provided to an output power amplifier, which amplifies the gain-adjusted RF signal and provides the amplified signal to the device's antenna.

Traditional RF transmitters include the transmit digital sections, the transmit digital analog converter (DAC), and the modulators on a complementary metal oxide semiconductor (CMOS) die, and the variable gain amplifier constructed on a separate silicon-germanium (SiGe) die. Although these traditional transmitters may produce RF signals having adequate signal quality, the multiple-die architecture is a fairly expensive portion of the overall device manufacturing costs. In addition, the continuing industry trend is toward reducing device sizes, and the multiple-die architecture places limitations on the ability to reduce the size of the device's RF transmitter. Accordingly, what are needed are methods and apparatus for automatic gain control for transmitted RF signals, which produce signals having acceptable signal quality, and which permit reductions in device manufacturing costs and/or device sizes.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION

Figure 1:
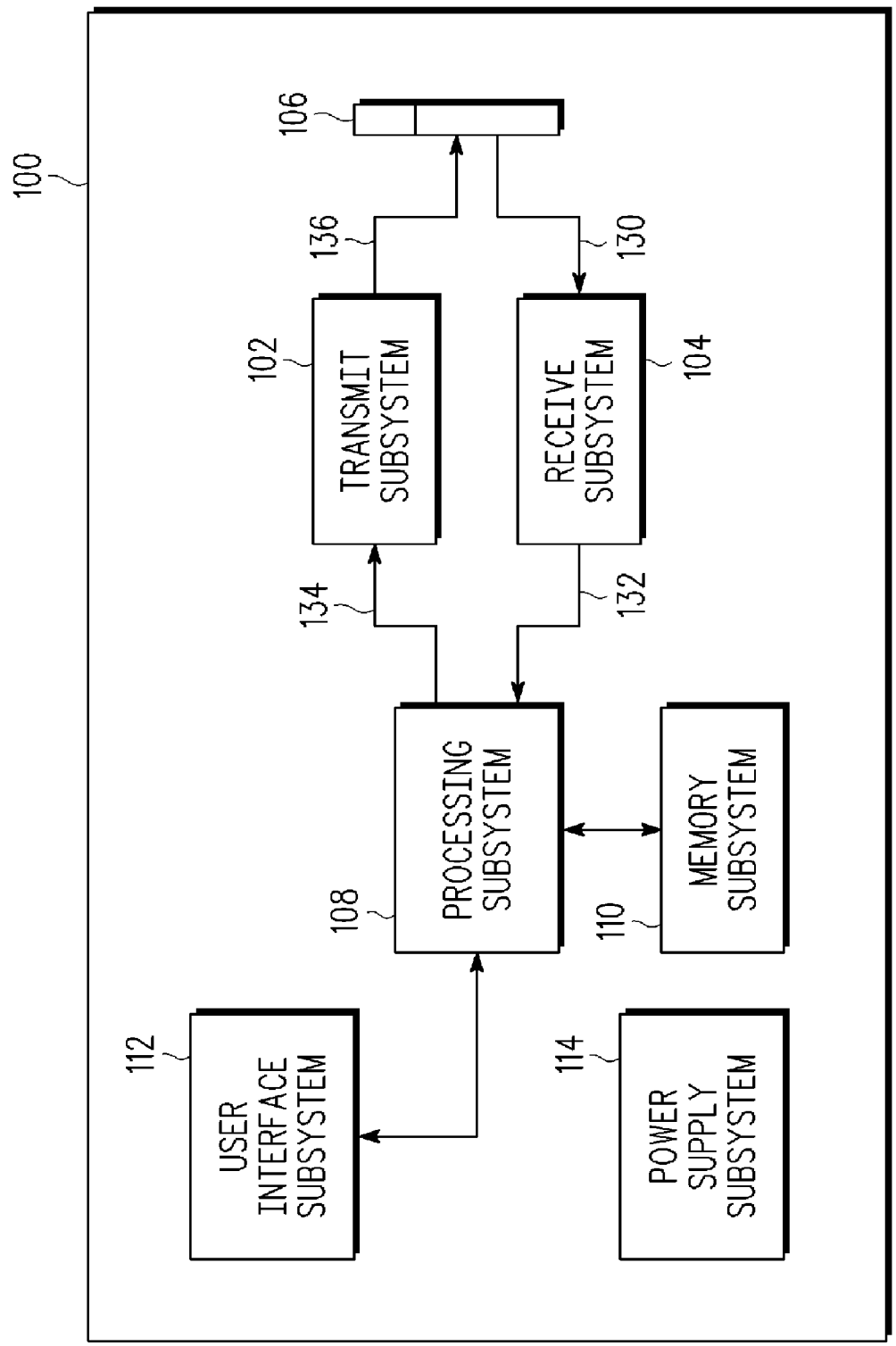
FIG. 1 illustrates a simplified block diagram of a wireless device, in accordance with an example embodiment.

Embodiments described herein include automatic gain control methods and apparatus applied to transmitted RF signals. Embodiments may be implemented, for example, in electronic systems and devices adapted to implement a wideband code division multiple access (W-CDMA) standard or protocol. As used herein, the term "W-CDMA" means a communication technology based on wideband CDMA, and interpretation of the term is not intended to be limited to the details of any particular sub-technology, standard or bandwidth. For example, but not by way of limitation, embodiments may be implemented in an electronic systems and devices that implement various standards, such as a 3$^{rd}$ Generation Partnership Project (3GPP) W-CDMA standard, 3$^{rd}$ Generation Partnership Project 2 (3GPP2) CDMA2000 1x-Ev-Do, Institute of Electrical and Electronics Engineers (IEEE) 802.16 and 802.20, and/or other standards.

Apparatus embodiments include RF transmitters that perform power control for transmitted signals. Embodiments of RF transmitters are adapted to alter or "smooth" portions of digital input signals in proximity to system-applied gain transitions. Performance of such alteration may reduce detrimental QoS effects that may otherwise occur if abrupt and unaltered gain transitions are applied to the transmitted signals. A particular embodiment of an RF transmitter includes a "segmented" or "stepped" variable gain amplifier (SVGA), which is adapted to apply a sequence of system-determined gains to an input signal. As used herein, the term "SVGA" means a variable gain amplifier which, at any given time, applies a gain to an incoming analog signal according to a digital gain signal provided to the SVGA. Because an SVGA is digitally controlled, a gain transition from a first gain value to a second gain value may appear to be an abrupt jump in the power profile of the output signal (e.g., the output signal's power profile may resemble a combination of the input signal with a square wave). In some cases, a gain transition may be implemented as a sequence of smaller gain transitions, and accordingly the power profile of the output signal may resemble a sequence of steps, which may be referred to below as a "ramp."

Embodiments may provide one or more advantages over traditional RF transmitter apparatus and methods. For example, embodiments of the SVGA portion of the RF transmitter may be implemented using CMOS technologies, although this is not a requirement. Accordingly, the SVGA portion of the RF transmitter may be constructed on the same die as the power amplifier. This may enable device designers to reduce the die count for a device, and thus embodiments may have the advantage of reducing device manufacturing costs, device sizes, and power consumption. In addition, as will be explained in detail below, embodiments include circuitry adapted to compensate for potentially detrimental signal characteristics that may otherwise be encountered using an SVGA in a transmitter design. Accordingly, embodiments may provide the advantages of reduced device manufacturing costs, device sizes, and power consumption while producing signals having acceptable signal characteristics.

FIG. 1 illustrates a simplified block diagram of a wireless device 100, in accordance with an example embodiment. Device 100 is adapted to transmit electromagnetic signals over an air interface. In more specific embodiments, wireless device 100 is adapted to transmit W-CDMA signals over an air interface according to a W-CDMA standard. Wireless device 100 may form substantially all of or a portion of a variety of different types of apparatus. For example, but not by way of limitation, wireless device 100 may form substantially all of or a portion of a cellular telephone, a radio, a personal data assistant (PDA), a computer (e.g., a laptop, notebook, desktop or other type of computer), and/or another device that is adapted to transmit electromagnetic signals over an air interface.

Wireless device 100 includes at least one transmit subsystem 102, receive subsystem 104, antenna 106, processing subsystem 108, memory subsystem 110, user interface subsystems 112, and power supply subsystem 114, in an embodiment. These subsystem are electrically coupled together as illustrated in FIG. 1, where the term "electrically coupled" means that electrical signals are transmissible through various interconnections between the subsystems. The interconnections between the subsystems may be direct interconnections that include conductive transmission media, or may be indirect interconnections that include one or more intermediate electrical components. Although certain interconnections are illustrated in FIG. 1, it is to be understood that more, fewer or different interconnections may be present in other embodiments.

The at least one processing subsystem 108 is adapted to perform various functions. These functions may include, for example, generating outgoing digital signals 134, processing incoming digital signals 132, interfacing with the at least one memory subsystem 110 to store and retrieve data, interfacing with the at least one user interface subsystem 112, and performing various power control functions in conjunction with the at least one power supply system 114. The at least one power supply system 114 may include, for example, an interface to line power and/or a battery power subsystem.

User interface subsystem 112 may include one or more user interface components adapted to enable a user to input commands or other information into device 100 and/or to provide visual, auditory, or mechanical indicia intended to convey information to the user. For example, but not by way of limitation, user interface subsystem 110 may include one or more display screens, touch screens, lights, speakers, vibration devices, keypads, buttons, dials, and/or other components adapted to receive input commands and/or to produce information-conveying indicia.

Memory subsystem 110 may include one or more components adapted to store digital information in a retrievable format. For example, but not by way of limitation, memory subsystem 110 may include one or more removable or non-removable, volatile or non-volatile memory components, such as ROM-based memory components, RAM-based memory components, CDs, DVDs, and/or magnetic storage media (e.g., hard disks or floppy disks), to name a few.

Receive subsystem 104 is adapted to receive incoming RF signals 130 from antenna 106, and to perform down-conversion, filtering, and analog-to-digital conversion, among other things, to the incoming RF signals 130 in order to generate incoming digital signals 132. The incoming digital signals 132 may be processed by processing subsystem 108. In an alternate embodiment, for a transmit-only type of device, receive subsystem 104 may be excluded.

Transmit subsystem 102 (also referred to herein as a "transmitter" or "RF transmitter") is adapted to receive outgoing digital signals 134 generated by processing subsystem 108, and to perform digital-to-analog conversion, up-conversion, automatic gain adjustment, and amplification, among other things, to the outgoing digital signals 134 in order to generate outgoing RF signals 136. The outgoing RF signals 136 are transmitted over the air interface by antenna 106. According to various embodiments, transmit subsystem 102 is adapted to apply a variable gain to outgoing digital signals 134 based on a sequence of gain control commands and/or a variable gain control signal. Gain adjustments may be applied, for example, when an estimate of the received SIR ("$SIR_{est}$") is significantly different from a target SIR ("$SIR_{target}$"). When $SIR_{est} > SIR_{target}$, for example, a gain control command may be issued to decrease the gain applied to the outgoing digital signal 134, and when $SIR_{est} < SIR_{target}$, a gain control command may be issued to increase the gain applied to the outgoing digital signal 134. The resulting gain-adjusted signal is amplified by an output amplifier and provided to the device's antenna 106. Gain adjustments may be produced by a variable gain amplifier (VGA) or, more specifically, an SVGA, in a particular embodiment.

Gain adjustments may occur frequently or only occasionally. For example, in the case of W-CDMA, gain adjustments may occur for each consecutive slot (e.g., every 10-15 milliseconds (ms)) in one scenario, although in practice, gain adjustments likely would occur less frequently (e.g., each 5 or 10 slots). During operations, abrupt adjustments to the gain may cause significant RF glitches at the antenna output. This may, in turn, cause the device to fail one or more QoS requirements, such as BLER, BER, ACLR, and/or other requirements. A relatively high BLER and/or BER may result in low perceived signal quality, decreased call establishment rates, and/or increased dropped call incidences, and a significant degradation of the ACLR may indicate relatively high interference to adjacent and/or alternate channel users.

As will be described in detail below, transmit subsystem 102 is adapted to apply gain adjustments to the outgoing RF signal 136 in proximity to SVGA-imposed gain transitions in order to reduce potentially detrimental effects on QoS that un-adjusted gain transitions otherwise may produce. To accomplish this, transmit subsystem 102 performs a gain adjustment process on the outgoing RF signal 136, in various embodiments, as will be described later in conjunction with FIGS. 5-9. To illustrate potential advantages of these embodiments, the effects of abrupt gain transitions are first explained in conjunction with FIGS. 2-4.

Figure 2:
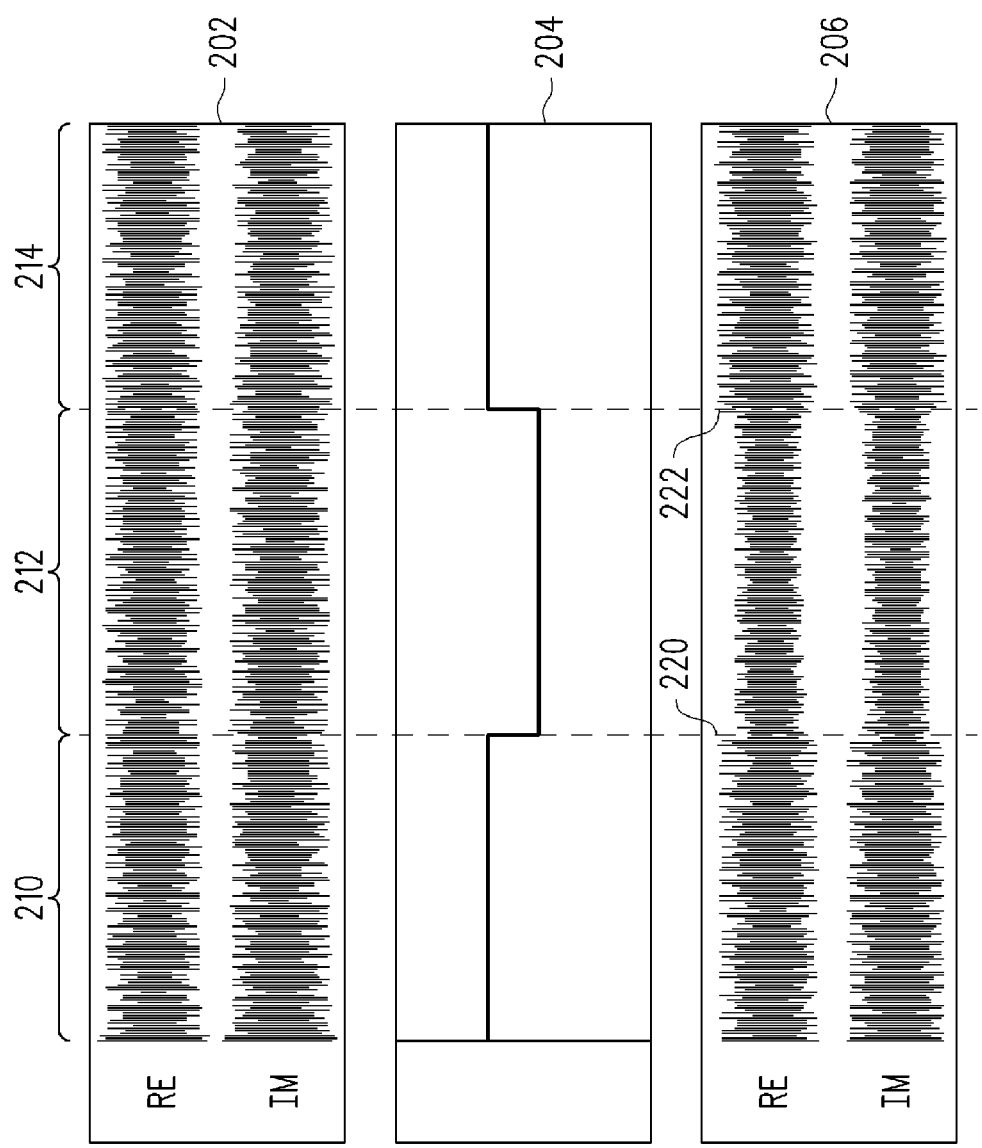
FIG. 2 illustrates time-domain representations of an example of a first W-CDMA signal to which a constant gain has been applied, a representation of a variable gain signal, and a second W-CDMA signal to which a variable gain has been applied.

FIG. 2 illustrates time domain representations of examples of a first W-CDMA signal 202 to which a constant gain has been applied, a representation of a variable gain signal 204, and a second W-CDMA signal 206 to which a variable gain (e.g., variable gain signal 204) has been applied. W-CDMA signals 202, 206 are represented in Cartesian coordinates, and accordingly, each includes a real ("RE") and an imaginary ("IM") signal component.

Figure 3:
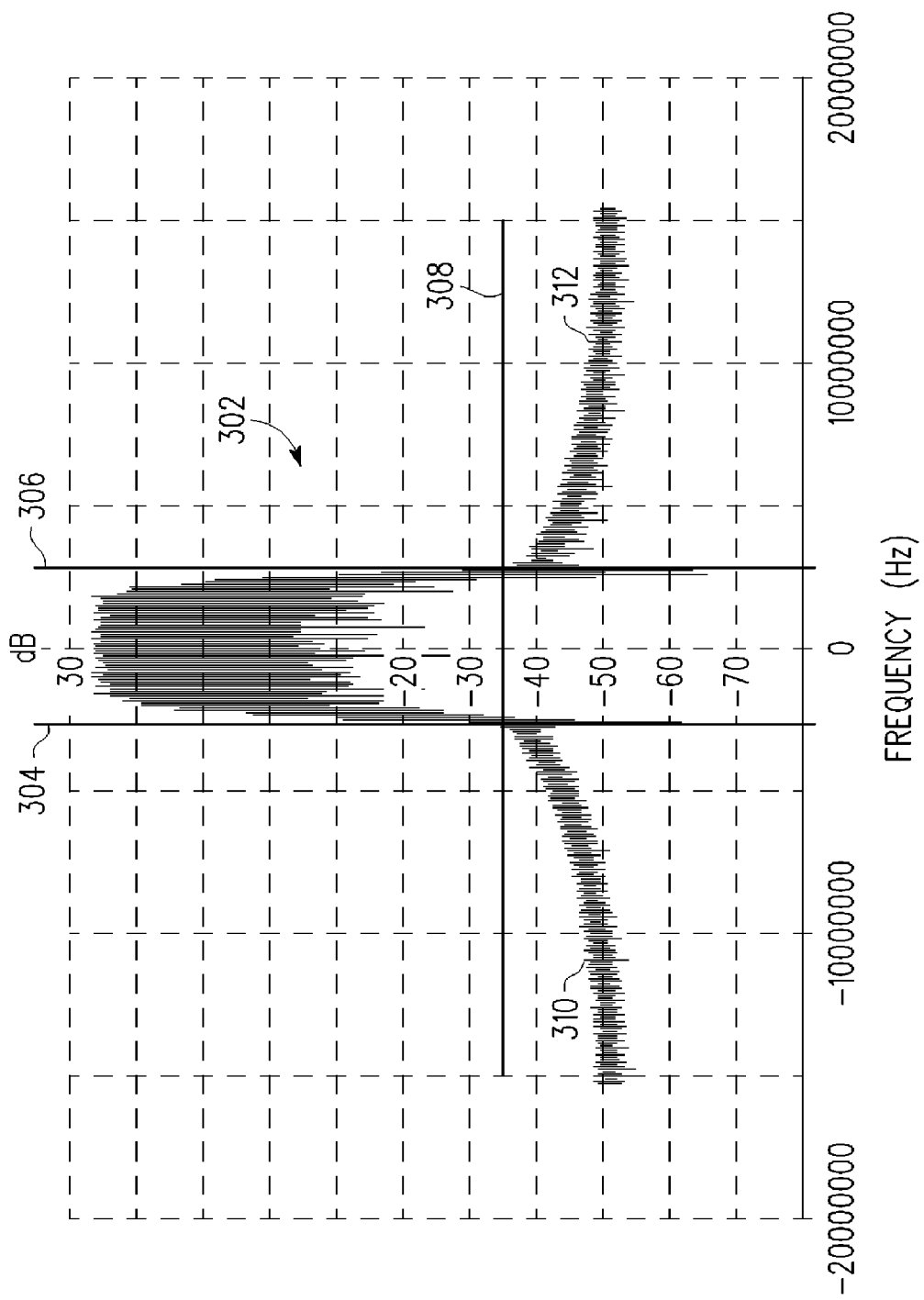
FIG. 3 illustrates a frequency spectrum, which may correspond to a W-CDMA signal having a substantially constant gain.

First W-CDMA signal 202 represents a signal in which a constant gain has been applied over a sequence of consecutive slots 210, 212, 214, where a slot may have a duration of about 10 to 15 ms, in an embodiment, although other slot durations could be implemented. A constant gain may be applied, for example, when $SIR_{est}$ approximately equals $SIR_{target}$. When first W-CDMA signal 202 is converted to the frequency domain, certain characteristics of first W-CDMA signal 202 may be observed. For example, FIG. 3 illustrates a frequency spectrum 302, which may correspond to a W-CDMA signal having a substantially constant gain, such as first W-CDMA signal 202 (FIG. 2). Vertical lines 304, 306 define the baseband frequency range (e.g., -2.5 to 2.5 Megahertz (MHz)), which corresponds to a 5 MHz bandwidth. Alternatively, bandwidths of 10 MHz, 20 MHz or some other bandwidth may be implemented. The portions of frequency spectrum 302 that occur outside the baseband frequency range reflect the out-of-band sidelobes 310, 312. As FIG. 3 illustrates, the peak level 308 of out-of-band sidelobes 310, 312 is about -35 decibels (dB). With an in-band spectral peak of about 27 dB as illustrated in FIG. 3, this represents a peak ACLR of about -70 dB at a 5 MHz bandwidth.

Referring again to FIG. 2, variable gain signal 204 conceptually represents an example of a gain signal, which may be applied to a W-CDMA signal (e.g., to first W-CDMA signal 202). The example variable gain signal 204 is represented as a square wave with a period of two slots, which corresponds to a gain signal with a transition at each slot boundary. Application of variable gain signal 204 to a W-CDMA signal may be mathematically represented as a multiplication of the W-CDMA signal with the variable gain signal 204. This may result, for example, in a signal such as second W-CDMA signal 206. As can be observed from FIG. 2, second W-CDMA signal 206 includes abrupt gain transitions at the slot boundaries 220, 222. These abrupt gain transitions may be, for example, SVGA-imposed gain transitions.

Figure 4:
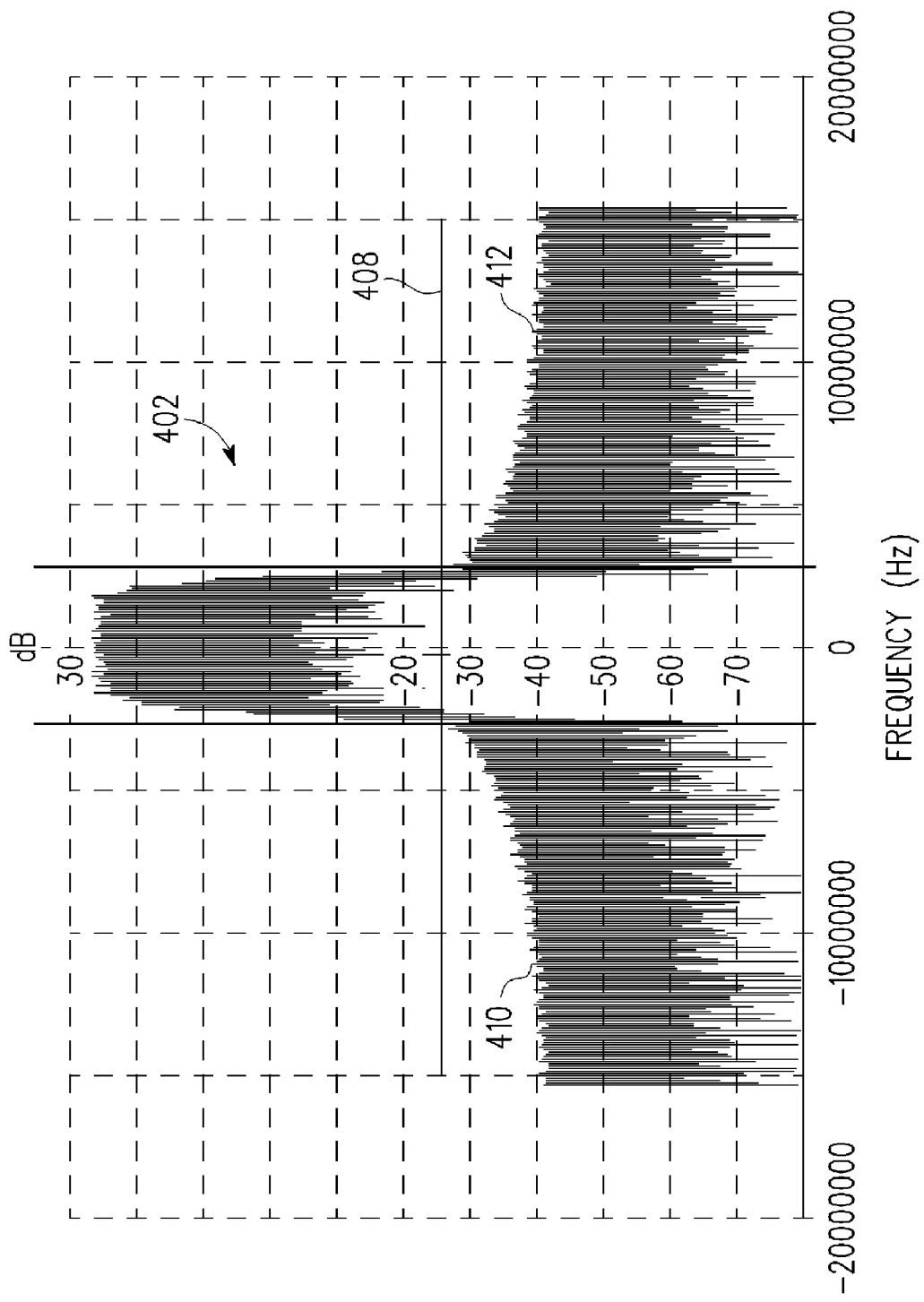
FIG. 4 illustrates a frequency spectrum, which may correspond to a W-CDMA signal having abrupt gain transitions.

Because multiplication of a W-CDMA signal with a variable gain signal (e.g., a square wave) in the time domain may be represented as convolution of the spectrum of these signals in the frequency domain, these abrupt gain changes may affect the frequency characteristics of the second W-CDMA signal 206 in a detrimental manner. For example, FIG. 4 illustrates a frequency spectrum 402, which may correspond to a W-CDMA signal having abrupt gain transitions, such as second W-CDMA signal 206 (FIG. 2). As FIG. 4 illustrates, the peak level 408 of out-of-band sidelobes 410, 412 is about -27 dB. Comparison of the frequency spectrum 302 (FIG. 3) for a substantially constant gain W-CDMA signal with the frequency spectrum 402 (FIG. 4) for a W-CDMA signal having abrupt gain transitions illustrates the significant and detrimental effects that those gain transitions may produce. More specifically, the peak level 408 of the out-of-band sidelobes 410, 412 of frequency spectrum 402 is approximately 8 dB higher than the peak level 308 of the out-of-band sidelobes 310, 312 of frequency spectrum 302. With an in-band spectral peak of about 27 dB as illustrated in FIG. 4, this represents a peak ACLR of about -23 dB at a 5 MHz bandwidth. Accordingly, the W-CDMA signal reflected by spectrum 402 (FIG. 4) may have a substantially degraded ACLR and/or higher BER when compared to the W-CDMA signal corresponding to spectrum 302 (FIG. 3), and also may fail one or more QoS requirements. In addition, higher out-of-band sidelobe levels may result in adjacent channel interference.

As mentioned above, embodiments of RF transmitters are adapted to apply digital adjustments to the gain of an outgoing RF signal in proximity to SVGA-imposed gain transitions in order to reduce potentially detrimental, effects on QoS that unmodified gain transitions otherwise may produce. To accomplish this, embodiments of RF transmitters perform a gain adjustment process on the outgoing RF signal, as will now be described in detail in conjunction with FIGS. 5-8.

Figure 5:
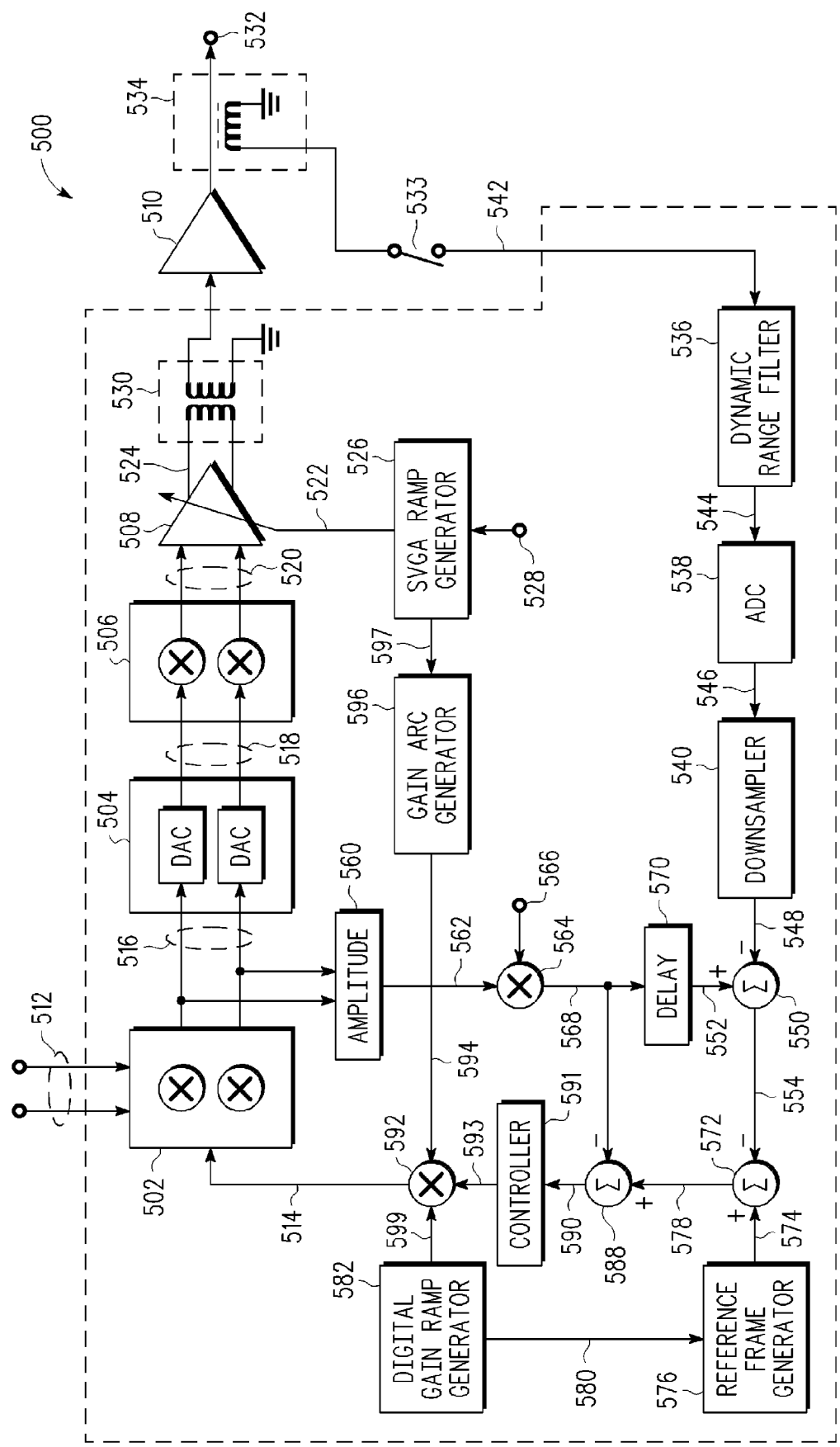
FIG. 5 illustrates a simplified block diagram of a portion of an RF transmitter, in accordance with an example embodiment.

FIG. 5 illustrates a simplified block diagram of a portion of a transmitter 500, in accordance with an example embodiment. Transmitter 500 may correspond, for example, to transmit subsystem 102, FIG. 1. As will be explained in more detail below, transmitter 500 is adapted dynamically to adjust the gain of an RF antenna output signal 532 (e.g., outgoing RF signal 136, FIG. 1), based on power control related commands received from other portions of the system (e.g., from processing subsystem 108, FIG. 1). Upon receipt of such a command, one or more processing and/or firmware portions of transmitter 500 converts the power control related command into gain control related signals (e.g., gain control input signal 528, among other things) for various gain control elements within transmitter 500 (e.g., digital gain ramp generator 582, SVGA ramp generator 526, reference frame generator 576, and/or other control points). The gain control elements receive the gain control related signals, and adaptively adjust the output signal gain according to the gain control related signals.

Along the transmit lineup, transmitter 500 includes a combiner 502, a digital-to-analog converter (DAC) block 504, an RF modulator 506, an SVGA 508, and a power amplifier 510. In addition, transmitter 500 includes a feedback loop, a digital gain ramp generator 582, and a digital gain signal generator.

Combiner 502 is adapted to receive a digital input signal 512 (e.g., outgoing digital signal 134, FIG. 1) and a digital gain signal 514, and to apply digital gains represented by the digital gain signal 514 to the digital input signal 512. In an embodiment, digital input signal 512 includes a sequence of multiple input data samples, which may include, for example, a sequence of discrete time samples of a signal to be transmitted (e.g., a transmission burst). Digital input signal 512 could represent, for example, baseband, time-domain representations of a sequence of signal bursts produced using W-CDMA technology. In alternate embodiments, digital input signal 512 could be produced using any of a number of other technologies, including GSM (Global System for Mobile communications or Groupe Special Mobile), EDGE (Enhanced Data rates for GSM Evolution), TDMA (Time Division Multiple Access), CDMA (Code Division Multiple Access), OFDM (Orthogonal Frequency Division Multiplexing), or some other technology.

In an embodiment, digital input signal 512 includes a sequence of complex values represented in Cartesian coordinates, so that each value has a real part (I) and an imaginary part (Q), which are received in parallel. Accordingly, digital input signal 512 may include a sequence of values that may be represented as $X(k)=[I(k),Q(k)]$, where k indicates a sample number and $k=1 \ldots K$, $I(k)$ represents a real part of an input data sample, and $Q(k)$ represents an imaginary part of an input data sample. In alternate embodiments, digital input signal 512 may include sequences of values represented in polar coordinates or some other representation.

Combiner 502 applies the digital gains represented by digital gain signal 514 to the digital input signal 512 in order to generate a pre-compensated digital signal 516. Digital gain signal 514 is generated by a digital gain signal generator, which is adapted to generate a digital gain signal that incorporates a gain arc into the digital gain signal based on a gain control input signal. Digital gain signal 514 includes a sequence of digital values that, when applied to digital input signal 512, should have the effect of pre-compensating for gains that will be applied by SVGA 508 to a corresponding analog portion of an RF signal 520. Essentially, digital gain signal 514 includes a sequence of digital values that are inversely related to the gains that will be applied by SVGA 508 to the R.F signal 520. Generation of digital gain signal 514 will be described in more detail later.

The pre-compensated digital signal 516 that is generated by combiner 502 is received by DAC block 504. DAC block 504 performs an analog-to-digital conversion of the pre-compensated digital signal 516 in order to generate a pre-compensated analog signal 518. The pre-compensated analog signal 518 may be filtered by a baseband filter (not illustrated) in order to attenuate out-of-band components, in an embodiment. RF modulator 506 receives the pre-compensated analog signal 518, and up-converts the pre-compensated analog signal 518 to an appropriate carrier frequency in order to generate an RF signal 520, which is also referred to herein as a "pre-adjusted analog signal."

SVGA 508 is adapted to receive the RF signal 520 and a gain ramp signal 522, and to apply a sequence of gains represented by the gain ramp signal 522 to the RF signal 520 in order to generate a gain-adjusted RF signal 524, which is also referred to herein as a "gain-adjusted analog signal". Gain ramp signal 522 is generated by SVGA ramp generator 526 based on a gain control input signal 528. Gain control input signal 528 indicates a system-determined gains that are to be applied to the RF signal 520 by, for example, SVGA 508. More specifically, gain control input signal 528 indicates the system-determined gains that are to be applied to the RF signal 520 at various times. As discussed previously, the gain applied to the RF signal 520 may vary from slot-to-slot, and accordingly a gain transition may be applied at each slot boundary (or elsewhere). In an embodiment, gain control input signal 528 indicates a power change and a direction of change (e.g., the gain control input signal 528 includes a power change command). In another embodiment, gain control input signal 528 indicates a gain value. The values for the system-determined gain may be based on various factors, such as a comparison between the then-current, received SIR and a target SIR, for example.

In an embodiment, the gain ramp signal 522 includes a sequence of codes (e.g., 6-bit codes), each of which corresponds to a gain level that may be applied by SVGA 508 to RF signal 520. Each code provided to the SVGA 508 affects the enablement or disablement of various portions of the circuitry of SVGA 508, which results in the application of different gain levels being applied to RF signal 520 for different codes. The codes provided in gain ramp signal 522 may change on a slot-by-slot basis, or may be maintained for a plurality of slots, in various embodiments. An SVGA gain transition, either upward or downward, is implemented by changing the code provided within gain ramp signal 522. An SVGA gain transition may be applied in one discrete step or in multiple steps. Accordingly, although the term "gain ramp" is used herein, it is not meant to imply a linear function between two points. Instead, as used herein, the term "gain ramp" is meant to include a sequence of multiple (e.g., two or more) gain values, where gain transitions between subsequent gain values are made in discrete steps.

After SVGA 508 applies the gain to the RF signal 520 in accordance with the gain ramp signal 522, the resulting gain-adjusted RF signal 524 is de-coupled through transformer 530 and received by power amplifier 510. Power amplifier 510 amplifies the de-coupled, gain-adjusted RF signal 524 to generate an RF antenna output signal 532. The RF antenna output signal 532 is transmitted over the air interface by an antenna (e.g., antenna 106, FIG. 1).

As mentioned above, combiner 502 applies digital gains represented by digital gain signal 514 to the digital input signal 512. In an embodiment, multiple signal components are combined together to generate digital gain signal 514. The signal components that are combined to generate digital gain signal 514 depend on whether the feedback loop is open or closed, and/or whether a gain adjustment process is being performed. Embodiments of a feedback loop are described in detail next. Embodiments of gain adjustment processes will be described in detail later.

The feedback loop is adapted to generate a difference signal (e.g., accumulated difference signal 593), which indicates distortion added to RF antenna output signal 532 by at least the power amplifier 510 (and possibly other transmitter elements). As will be described in more detail below, combiner 592 is adapted to incorporate accumulated difference signal 593 into the digital gain signal 514 when the feedback loop is "closed." In an embodiment, when the gain adjustment process is being performed, the transmitter's feedback loop is de-activated (e.g., "open"). Conversely, the feedback loop is activated (e.g., "closed") at other times. For description purposes, a switch 533 is illustrated in the feedback loop to indicate that the feedback loop may be open or closed (e.g., de-activated or activated) at various times. In practice, such a switch 533 may not actually be present. When the feedback loop is closed, gain application element 502 is adapted to combine the digital input signal 512 with the digital gain signal 514, with the intended result being that the combination will pre-distort the digital input signal 512 in a manner that mitigates non-linear distortion that may be produced by one or more non-linear devices in the transmit lineup (e.g., SVGA 508 and/or power amplifier 510). Although a particular embodiment of a feedback loop is illustrated in FIG. 5 and described herein, it is to be understood that any of a number of other types of feedback loops may be incorporated into transmitter 500, in other embodiments.

The feedback loop includes a power detector 534, a dynamic range filter 536, an analog-to-digital converter (ADC) 538, and a downsampler 540, in an embodiment, along with other loop elements that will be discussed below. Power detector 534 detects the power level of the RF antenna output signal 532, and converts that power level into an analog voltage signal 542. Dynamic range filter 536 receives the analog voltage signal 542 and adjusts the dynamic range of the analog voltage signal 542 to generate a dynamic range-adjusted, analog voltage signal 544. In an embodiment, dynamic range filter 536 adjusts the analog voltage signal 542 to use substantially all of the dynamic range of the antenna output. ADC 538 receives the dynamic range-adjusted, analog voltage signal 544, and performs a sampling and quantizing process to generate a first digital feedback signal 546. Downsampler 540 is adapted to receive and downsample the first digital feedback signal 546 to generate a second digital feedback signal 548, which reflects the power of the RF antenna output signal 532. In an embodiment, downsampler 540 includes a multiple-order Cascaded Integrator-Comb (CIC) filter, such as a $4^{th}$ order CIC, for example.

The feedback loop also includes a first comparator 550, which receives and compares the second digital feedback signal 548 and a delayed version 552 of the pre-compensated digital signal 516. First comparator 550 generates a first difference signal 554 between the second digital feedback signal 548 and the delayed version 552 of the pre-compensated digital signal 516. The difference signal 554 reflects the signal distortion characteristics introduced by SVGA 508, power amplifier 510, and other system elements within the transmit chain and the feedback loop. The delayed version 552 of the pre-compensated digital signal 516 is generated through a sample-and-delay path, which includes a signal amplitude determination block 560 adapted to receive and convert the pre-compensated digital signal 516 into a digital amplitude signal 562. A gain application element 564 applies a gain to the digital amplitude signal 562 based on gain control signal 566, in order to generate a gain-adjusted, digital amplitude signal 568. Gain control signal 566 corresponds to the gains that are applied to corresponding portions of the RF signal 520 by SVGA 508. Delay element 570 delays the gain-adjusted, digital amplitude signal 568 by a time period that results in synchronization between the delayed version 552 of the pre-compensated digital signal 516 and the second digital feedback signal 548.

The first difference signal 554 generated by first comparator 550 is received by second comparator 572, and compared with a reference frame signal 574 generated by reference generator 576, in order to generate a second difference signal 578. The reference frame signal 574 is generated to compensate, inversely, for a digital inverse ramp signal 599 that will be generated by digital gain ramp generator 582 and incorporated into the digital gain signal 514. Reference generator 576 receives information relating to the digital inverse ramp signal 599 in a ramp information signal 580 received from digital gain ramp generator 582. The second difference signal 578 generated by second comparator 572 is received by third comparator 588, and compared with the gain-adjusted, digital amplitude signal 568, in order to generate a third difference signal 590. Controller 591 receives and accumulates third difference signal 590, in order to generate an accumulated difference signal 593. In an embodiment, combiner 592 generates the digital gain signal 514 by combining the accumulated difference signal 593 with a digital inverse ramp signal 599, which is generated by digital ramp generator 582. In an embodiment, digital inverse ramp signal 599 is inversely related to gain ramp signal 522. More particularly, in an embodiment, digital inverse ramp signal 599 includes a sequence of digital values that are inversely related to the sequence of gains indicated in gain ramp signal 599.

As mentioned above, when the gain adjustment process is being performed, the feedback loop is deactivated, which may be represented as switch 533 being open. At those times, combiner 592 does not combine the accumulated difference signal 993 with the digital inverse ramp signal 599, but instead combines a gain arc signal 594 with the digital inverse ramp signal 599 to generate the digital gain signal 514. The process of performing gain adjustment will now be discussed, in accordance with various embodiments.

As used herein, "gain adjustment" and "gain adjustment process" refers to the process of incorporating one or more "gain arcs" into the digital gain signal 514, which may have the effect of reducing detrimental effects, in terms of spectral performance or other effects, of abrupt gain transitions applied by SVGA 508. During performance of the gain adjustment process, transmitter 500 may incorporate a gain arc into a portion of the digital gain signal 514 that correlates with a portion of the digital input signal 512 across which SVGA 508 will apply a gain transition, in an embodiment. In another embodiment, transmitter 500 may incorporate a gain arc into a portion of the digital gain signal 514 that correlates with a portion of the digital input signal 512 across which SVGA 508 will apply a gain transition, when that gain transition meets or exceeds a threshold (e.g., 5 dB, 10 dB, or some other value) or satisfies some other criteria. In other words, incorporation of a gain arc into the digital gain signal 514 may be done selectively. As used herein, a "gain arc" includes a sequence of digital values that defines an arc. Each gain arc may be characterized by an arc function, an arc depth, and a duration, as will be described in more detail later. Each gain arc also may be a function of the gain transition that is to be applied by SVGA 508 to the RF signal 520. In other words, a gain arc may include a sequence of digital values that defines an arc, where the sequence of digital values is related to the sequence of gains that are to be applied by SVGA 508.

In an embodiment, a digital signal generator of transmitter 500 generates the digital gain signal 514, within which a gain arc may be incorporated. An embodiment of a digital gain signal generator includes SVGA ramp generator 526, gain arc generator 596, digital gain ramp generator 582, and combiner 592. Although these elements are shown as separate elements in FIG. 5, it is to be understood that some or all of these elements and/or the functions that they perform, may be combined, in alternate embodiments. In addition, the arrangement of these elements may be different from that illustrated in FIG. 5, while still enabling performance of substantially the same function, in substantially the same way, to produce substantially the same result. Accordingly, variations of the configuration of elements illustrated in FIG. 5 are intended to be included within the scope of the inventive subject matter.

In an embodiment, in order to generate digital gain signal 514, a gain arc signal 594 first is generated. The gain arc signal 594 may include a sequence of gain arcs, which are generated by gain arc generator 596 based on gain ramp information 597 received from SVGA ramp generator 526, as described in this paragraph. Prior to SVGA ramp generator 526 providing gain ramp signal 522 to induce SVGA 508 to perform a gain transition for a particular portion of RF signal 520, SVGA ramp generator 526 receives a gain control input signal 528, as discussed previously. Based on the gain control input signal 528, SVGA ramp generator 526 generates gain ramp information 597, and provides that gain ramp information 597 to gain arc generator 596. In an embodiment, the gain ramp information 597 indicates one or more gains or gain transitions (e.g., gain differences) that SVGA ramp generator 526 will command SVGA 508 to apply to an upcoming portion of the RF signal 520. In an embodiment, the gain ramp information 597 includes a sequence of digital values (e.g., normalized values) that indicate the magnitudes of upcoming gains, and/or the directions (e.g., positive or negative) of upcoming gain transitions. For example, the gain ramp information 597 may indicate an upcoming gain transition of ±5 dB, ±10 dB, ±20 dB or some other value. The gain ramp information 597 may indicate multiple gains or gain transitions that include one or more steps between them. In such an embodiment, a duration of each of the one or more steps may be a programmable quantity.

Based on the received gain ramp information 597, gain arc generator 596 generates a gain arc signal 594, which includes a sequence of values that will be combined with the digital inverse ramp signal 599 to generate the digital gain signal 514. In an embodiment, gain arc generator 596 includes a processing element adapted to generate one or more gain arcs. In addition, in an embodiment, gain arc generator 596 includes or has access to a data storage element (e.g., ROM, RAM or some other type of storage), which is adapted to store one or more gain arc tables. A gain arc table includes multiple gain arc entries, each of which may define a gain arc having particular characteristics (e.g., arc depth, arc duration, and/or arc shape, as defined by a gain arc function). The processing element of gain arc generator 596 may select a particular gain arc entry from the gain arc table based on the gain ramp information 597 received from SVGA ramp generator 526. For example, gain arc generator 596 may determine, from the gain ramp information 597, an index into the gain arc table, and gain arc generator 596 may generate the gain arc signal 594 in accordance with gain ramp data and/or parameters in the selected gain arc table entry.

In an embodiment, each gain arc table entry may include a set of parameter values (e.g., arc duration, arc depth) that enable a gain arc to be calculated according to a gain arc function (e.g., a raised-cosine function). In another embodiment, a gain arc table entry may include a sequence of magnitude values for the gain arc. In still another embodiment, gain arc generator 596 may calculate the parameter values for a gain arc (e.g., arc duration, arc depth, and/or gain arc function) based on the gain ramp information 597 received from the SVGA ramp generator 526, and may generate the gain arc signal 594 based on those parameters. In still another embodiment, gain arc generator 596 may receive the parameter values for a gain arc (e.g., arc duration, arc depth, and/or gain arc function) from SVGA ramp generator 526 or elsewhere, and may generate the gain arc signal 594 based on those parameters. In the above-described embodiments, either or both the arc duration and the arc depth may be programmable quantities. In still another embodiment, the gain ramp information 597 may include a gain arc table index or offset.

Figure 6:
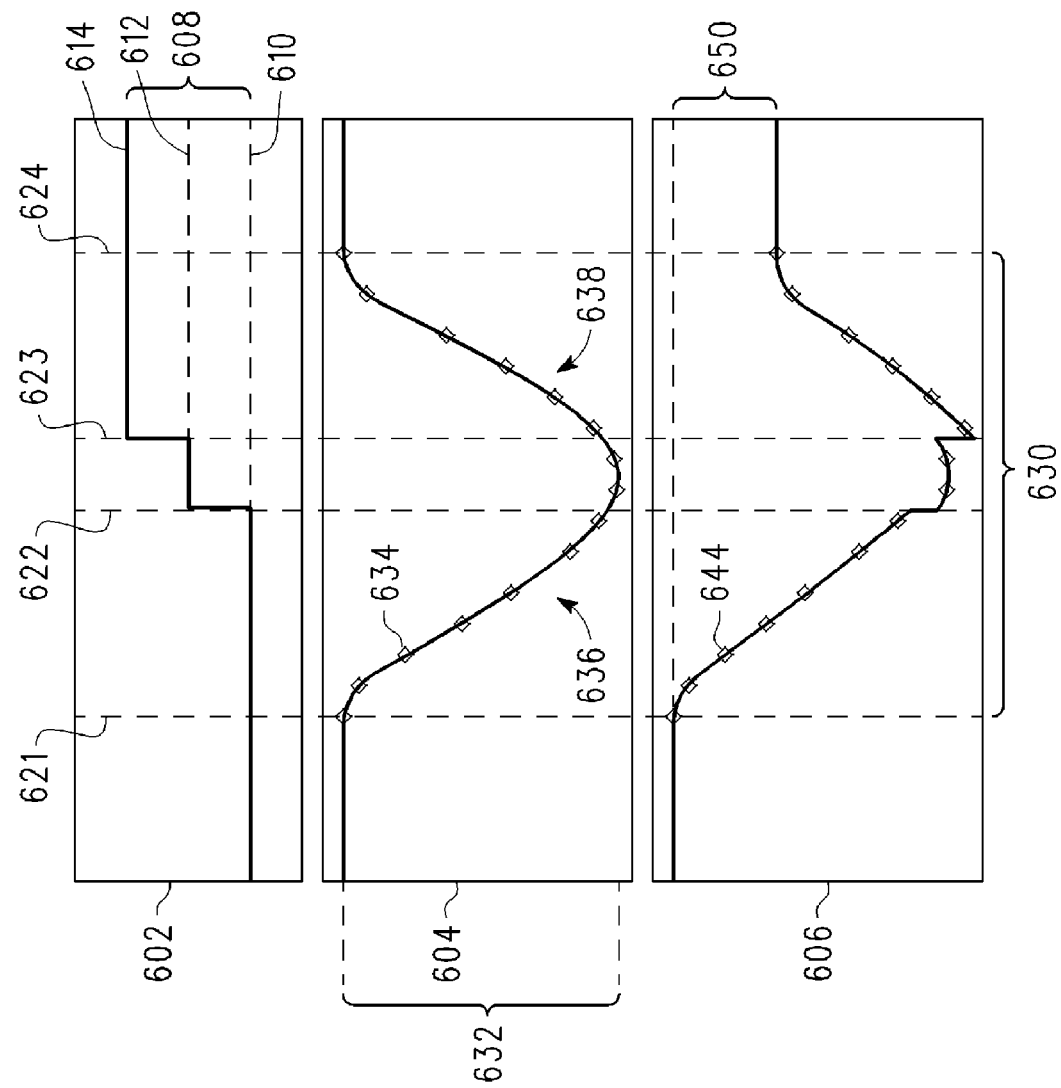
FIG. 6 illustrates time-domain representations of a step-up gain transition, an arc, and a step-up gain transition that is smoothed by the arc, in accordance with an example embodiment.
Figure 7:
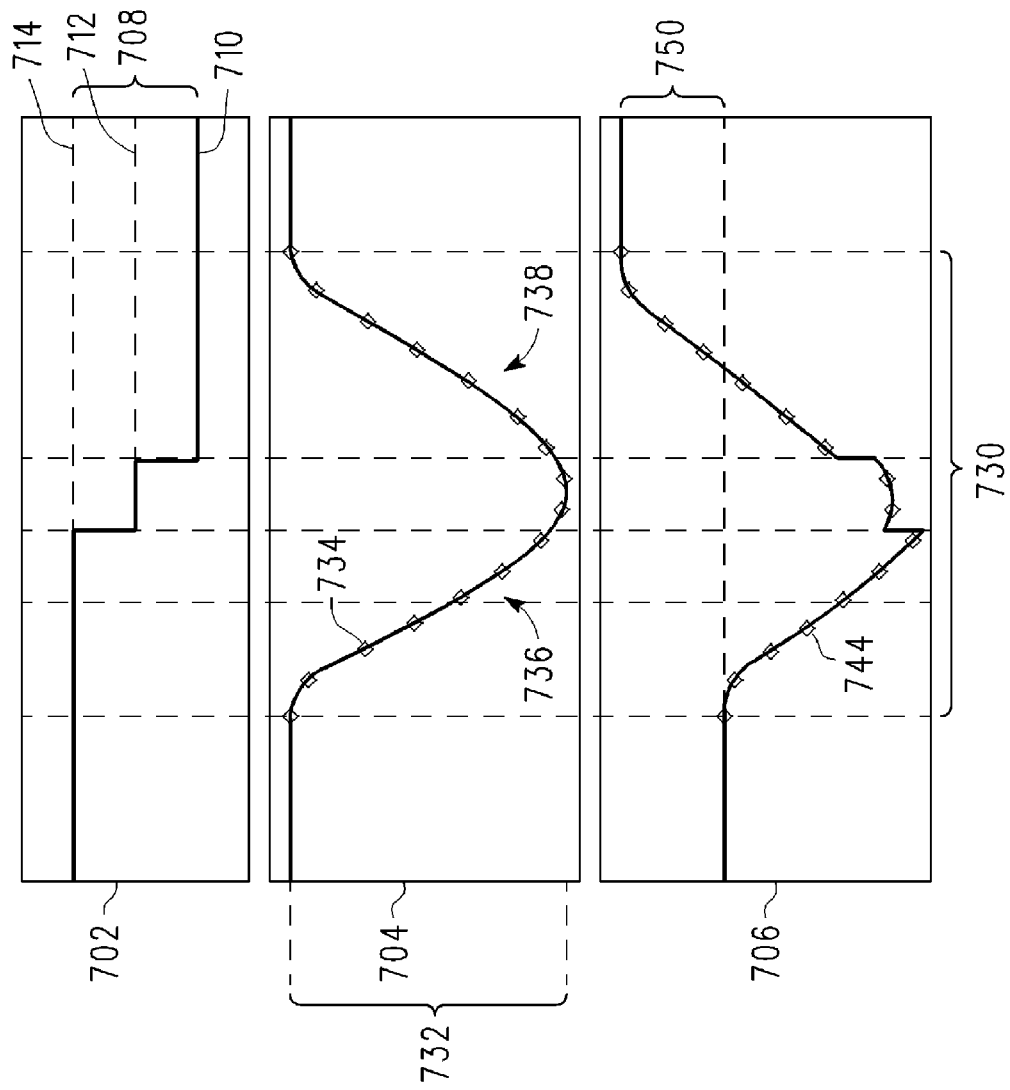
FIG. 7 illustrates time-domain representations of a step-down gain transition, an arc, and a step-down gain transition that is smoothed by the arc, in accordance with an example embodiment.

FIG. 6 illustrates time-domain representations of an SVGA gain level signal 602 corresponding to a step-up gain transition, a gain arc signal 604 (e.g., gain arc signal 594, FIG. 5), and a digital gain signal 606 (e.g., digital gain 514), in accordance with an example embodiment. Similarly, FIG. 7 illustrates time-domain representations of an SVGA gain level signal 702 corresponding to a step-down gain transition, a gain arc signal 704 (e.g., gain arc signal 594, FIG. 5), and a digital gain signal 706 (e.g., digital gain signal 514), in accordance with another example embodiment. SVGA gain level signals 602, 702 represent gain transitions that may be applied by an SVGA (e.g., SVGA 508, FIG. 5) in response to a gain ramp signal (e.g., gain ramp signal 522, FIG. 5). SVGA gain level signals 602, 702 are shown to implement a step-up gain transition and a step-down gain transition, respectively, in two gain transition steps (e.g., the total gain transition 608, 708 is applied in two steps).

As mentioned previously, gain transitions, such as those conveyed in SVGA gain level signals 602, 702, may be represented by a sequence of codes conveyed in a gain ramp signal (e.g., gain ramp signal 522, FIG.5). For example, for SVGA gain level signal 602, a first code may represent gain level 610, a second code may represent gain level 612, and a third code may represent gain level 614. Similarly, for SVGA gain level signal 702, a first code may represent gain level 710, a second code may represent gain level 712, and a third code may represent gain level 714. Although each of SVGA gain level signals 602, 702 illustrate gain transitions implemented in two steps, a gain transition may be implemented in as few as one step or may be implemented in more than two steps.

The total gain transitions 608, 708 reflected in SVGA gain level signals 602, 702 may be defined as a magnitude of the difference between an initial gain, $g1_{SVGA}$, and a final gain, $g2_{SVGA}$, or $g=|g2_{SVGA}-g1_{SVGA}|$. Either way, each gain transition may be characterized by a maximum gain transition rate, which may be defined, across a gain transition, as an average rate of change of gain over a transition time period, or $\Delta g/\Delta t$, where the transition time period may be defined as the period of time between onset and completion of the gain transition. For example, SVGA gain level signal 602 has an average gain transition rate, between time t2 622 (onset) and t3 623 (completion), equal to $|(g2_{SVGA}-g1_{SVGA})|/(t3-t2)$.

A gain arc signal (e.g., gain arc signal 594, FIG. 5) may be generated based on information (e.g., gain ramp information 597, FIG. 5) that describes a gain transition that will be applied by the SVGA (e.g., SVGA 508, FIG. 5). Still referring to FIGS. 6 and 7, a gain arc signal may be a signal having characteristics similar to one of gain arc signals 604, 704. Each of gain arc signals 604, 704 may be characterized by an arc duration 630, 730 (e.g., a duration measured as a number of values) and an arc depth 632, 732 (e.g., a depth measured in dB). In an embodiment, arc depth 632, 732 and arc duration 630, 730 are quantities that may be fixed (e.g., established in the factory), programmable (e.g., programmed at the factory and modifiable), or variable (e.g., dynamically adjustable). In an embodiment in which the arc depth 632, 732 and/or arc duration 630, 730 are variable, the transmitter (e.g., transmitter 500, FIG. 5) may evaluate system performance (e.g., ACLR, BLER, and/or BER), and the arc depth 632, 732 and/or duration 630, 730 may be adjusted in an attempt to adjust the system performance. For example, reducing arc depth 632, 732 may have the effect of decreasing the BER. However, a reduced arc depth 632, 732 also may have the effect of deteriorating the ACLR. Conversely, increasing arc depth 632, 732 may improve the ACLR while also increasing the BER. Accordingly, when a reduction of the BER is desired, the arc depth 632, 732 may be reduced, in an embodiment. Conversely, when an improvement in the ACLR is desired, the arc depth 632, 732 may be increased, in an embodiment. In various embodiments, the arc duration 630, 730 also may be selected and/or adjusted in order to adjust system performance. In a particular embodiment, arc depths in a range of 10 dB to 20 dB may be selected or specified, although arc depths having smaller or larger values may be selected or specified in other embodiments. Arc durations in a range of about 8 to 32 chips may be selected or specified, in an embodiment, although arc durations having more or fewer chips may be selected or specified in other embodiments.

Discrete values 634, 734 defining each of gain arc signals 604, 704 may be generated (e.g., by gain arc generator 596, FIG. 5) according to a selected mathematical function. In an embodiment, gain arc signals 604, 704 may be calculated based on a raised-cosine function (e.g., a Hanning windowing function), which may be represented as:

$$H(n)=0.5(1+\cos(\pi n/(N-1))), -(N-1)<=n<=N-1,$$

where N is the total number of values in the sequence that defines the arc, and n is an integer indexing the value within the sequence of values. In other embodiments, other mathematical functions and/or windowing functions also or alternatively may be used, including but not limited to Blackman window functions, Hamming window functions, Kaiser window functions, and/or other mathematical functions.

As discussed above, a gain arc signal (e.g., gain arc signal 594, FIG. 5) may be combined with a digital representation of an inverse of the gain ramp signal (e.g., digital inverse ramp signal 599, FIG. 5), in order to generate a digital gain signal (e.g., digital gain signal 514, FIG. 5), which is combined with the digital input signal (e.g. digital input signal 512, FIG. 5). Referring still to FIGS. 6 and 7, for example, a first portion 636, 736 of a gain arc signal 604, 704 may be applied to a first portion of the digital inverse ramp signal (e.g., digital inverse ramp signal 599, FIG. 5) that corresponds to samples that occur before a slot boundary (e.g., toward the end of a first slot), and a second portion 638, 738 of the gain arc signal 604, 704 may be applied to a second portion of the digital inverse ramp signal (e.g., digital inverse ramp signal 599, FIG. 5) that corresponds to samples that occur after the slot boundary (e.g., toward the beginning of a second subsequent slot). In an embodiment, the first portion 636, 736 includes approximately a first half of gain arc signal 604, 704, and the second portion 638, 738 includes approximately a second half of gain arc signal 604, 704. For example, for a gain arc having a duration of 16 chips, the first portion 636, 736 may include arc values corresponding to the first 7 chips, and the second portion 638, 738 may include arc values corresponding to the second 8 chips, as illustrated in FIGS. 6 and 7. In alternate embodiments, the first portion 636, 736 may include more or less than half of the arc values, and the second portion 638, 738 may include less or more than half of the arc values, respectively.

A digital gain signal (e.g., digital gain signal 514, FIG. 5) may be a signal having characteristics similar to one of digital gain signals 606, 706. The discrete values 644 of digital gain signal 606 correspond to a combination of gain arc signal 604 with a digital signal that is inversely related to SVGA gain level signal 602 (e.g., digital inverse ramp signal 599, FIG. 5). Similarly, the discrete values 744 of digital gain signal 706 correspond to a combination of gain arc signal 704 with a digital signal that is inversely related to SVGA gain level signal 702 (e.g., digital inverse ramp signal 599, FIG. 5). The total gain transitions 650, 750 reflected in digital gain signals 606, 706 may be defined as a magnitude of the difference between an initial gain, $g1_{digital}$, and a final gain, $g2_{digital}$, or $g=|(g2_{digital}-g1_{digital})|$. Similar to the gain transitions reflected in SVGA gain level signals 602, 604, each gain transition reflected in digital gain signals 606, 706 may be characterized by a gain transition rate $\Delta g/\Delta t$. For example, digital gain signal 606 has an average gain transition rate, between time t1 621 (onset) and t4 624 (completion), equal to $|(g2_{digital}-g1_{digital})|/(t4-t1)$.

Assuming proportional total gain transitions for the SVGA gain level signals 602, 702 and the digital gain signals 606, 706, it is apparent that the total gain transitions 650, 750 reflected in digital gain signals 606, 706 are performed over longer transition time periods. Accordingly, gain transitions 650, 750 have lower average gain transition rates than the gain transitions 608, 708 reflected in SVGA gain level signals 602, 604. By pre-distorting the digital input signal (e.g., digital input signal 512, FIG. 5) using a digital gain signal (e.g., digital gain signal 514, 606, 706) that has a lower average gain transition rate than the average gain transition rate of the SVGA, the frequency spectrum for the resulting gain-adjusted RF signal (e.g., gain-adjusted RF signal 524) may have lower sidelobe levels than a frequency spectrum for a gain-adjusted RF signal in which digital gain transitions are applied at substantially the same average gain transition rate as the gain transition rate of the SVGA. Gain transitions that are made according to embodiments discussed herein may be referred to as being "smoothed" gain transitions.

Figure 8:
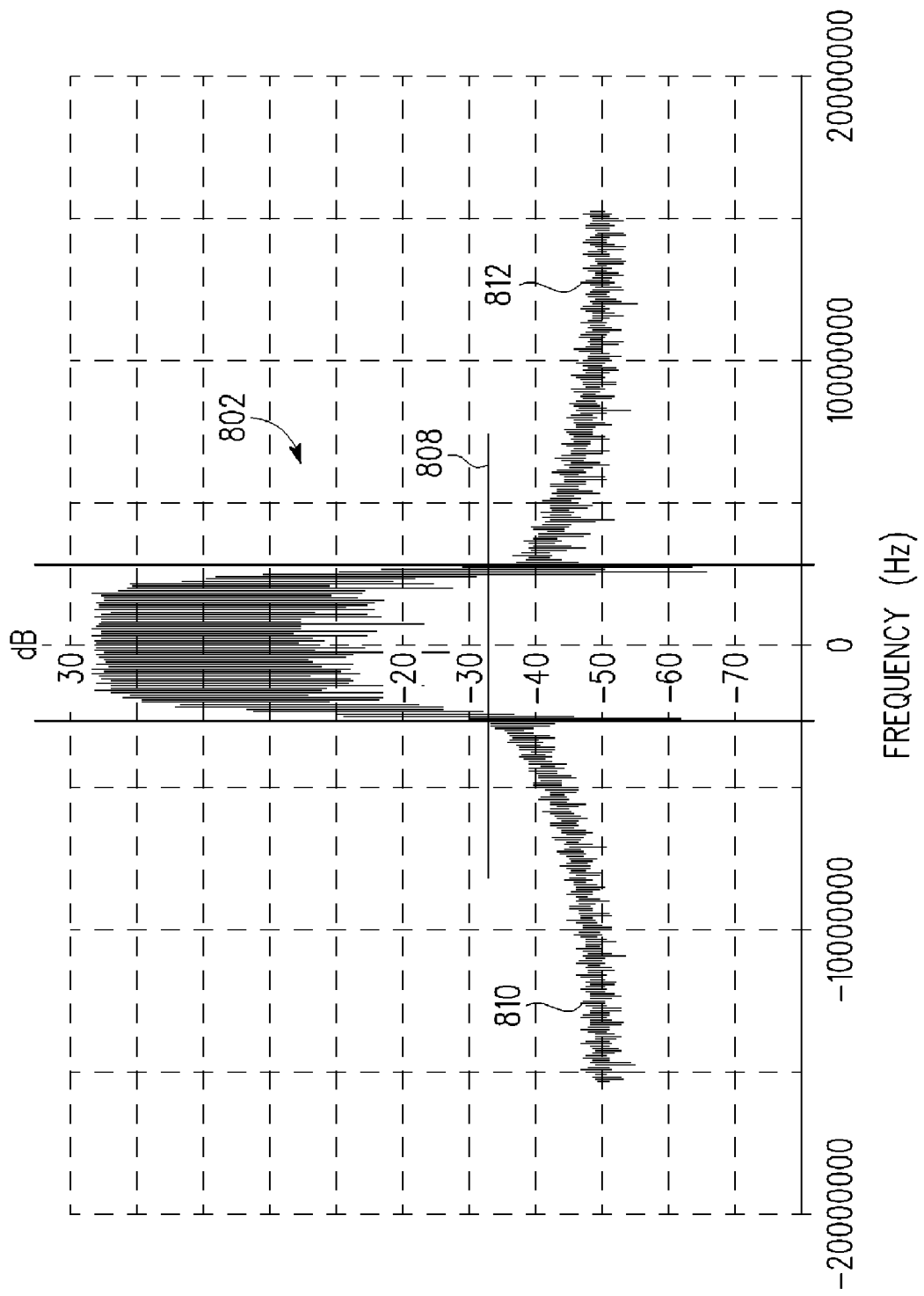
FIG. 8 illustrates a frequency spectrum, which may correspond to a W-CDMA signal having smoothed gain transitions.

FIG. 8 illustrates a frequency spectrum 802, which may correspond to a W-CDMA signal having smoothed gain transitions, in accordance with an embodiment. As FIG. 8 illustrates, the peak level 808 of out-of-band sidelobes 810, 812 is about −32 dB. Comparison of the frequency spectrum 802 (FIG. 8) for a W-CDMA signal having smoothed gain transitions with the frequency spectrum 402 (FIG. 4) for a W-CDMA signal having abrupt gain transitions illustrates potential advantage that may be achieved by smoothing gain transitions, in accordance with an embodiment. More specifically, the peak level 808 of the out-of-band sidelobes 810, 812 of frequency spectrum 802 is approximately 5 dB lower than the peak level 408 of the out-of-band sidelobes 410, 412 of frequency spectrum 402. With an in-band spectral peak of about 27 dB as illustrated in FIG. 8, this represents a peak ACLR of about −33 dB at a 5 MHz bandwidth and a 10 dB arc depth. Accordingly, the W-CDMA signal reflected by spectrum 802 (FIG. 8) may have a substantially improved ACLR and/or lower BER when compared to the W-CDMA signal corresponding to spectrum 402 (FIG. 4). In addition, the lower out-of-band sidelobe levels may result in a reduced likelihood for adjacent channel interference.

Figure 9:
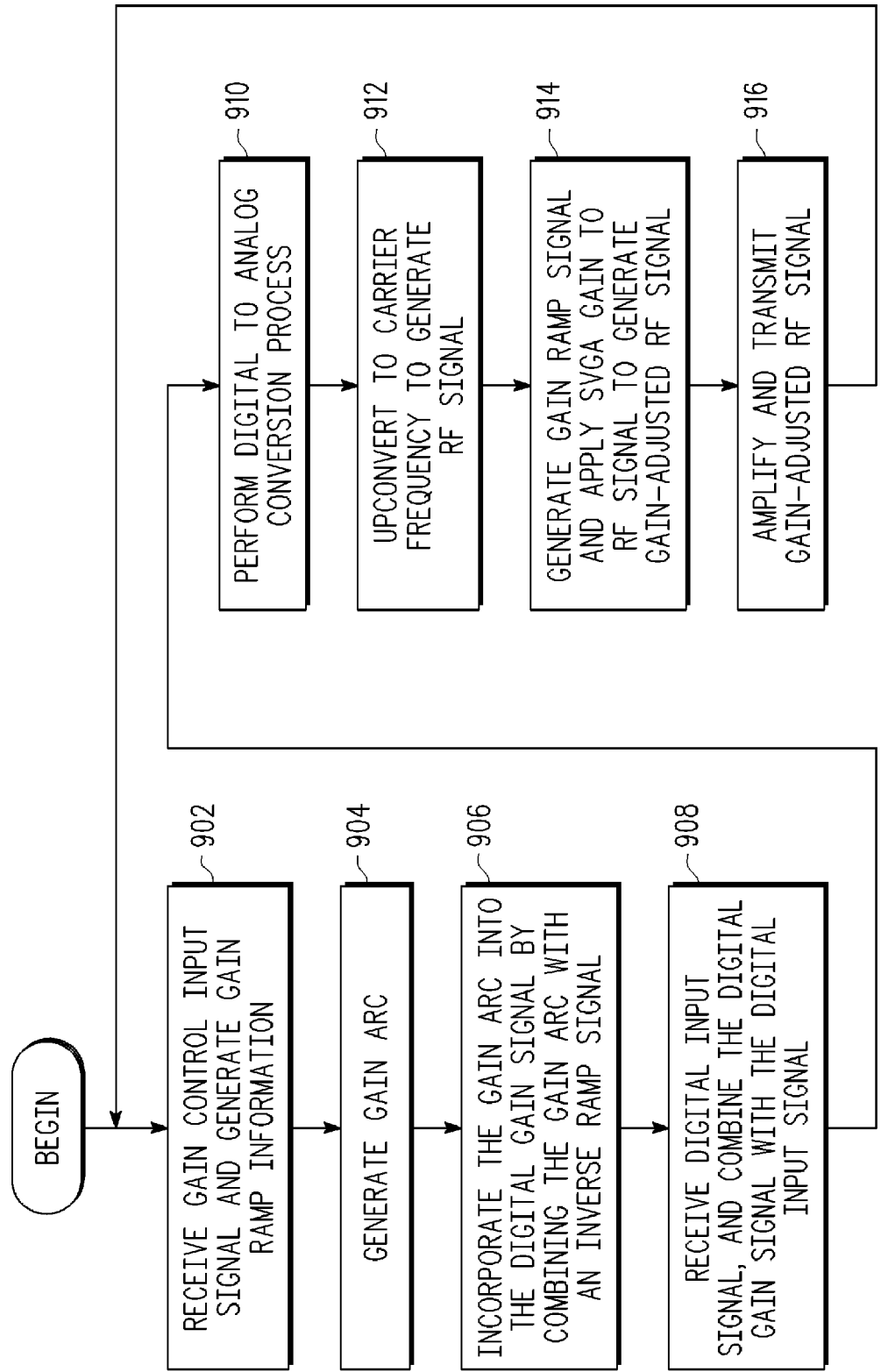
FIG. 9 illustrates a flowchart of a method for automatically performing gain control, in accordance with an example embodiment.

FIG. 9 illustrates a flowchart of a method for automatically performing gain control, in accordance with an example embodiment. Referring also to FIG. 5, the method may begin, in block 902, when a gain control input signal (e.g., gain control input signal 528) is received. For example, a gain control input signal may be a signal that indicates a system-determined gain that is to be applied by an SVGA (e.g., SVGA 508) to a portion of an RF signal (e.g., RF signal 520). In an embodiment, gain ramp information (e.g., gain ramp information 597) is generated (e.g., by SVGA ramp generator 526) based on the gain control input signal. The gain ramp information may indicate the gain or gain difference that SVGA will be commanded to the SVGA for application to an upcoming portion of the RF signal.

In block 904, a gain arc is generated based on the gain ramp information, or more specifically, based on characteristics of the gain ramp that will be applied by the SVGA to the portion of the RF signal. In an embodiment, a gain arc is generated by a gain arc generator (e.g., gain arc generator 596). The gain arc includes a sequence of values that define an arc, as discussed in detail previously. The gain arc may be generated, in an embodiment, by retrieving gain arc data (e.g., a sequence of gain magnitude values) and/or parameters (e.g., arc depth, arc duration) defining the gain arc from a gain arc table. In an alternate embodiment, the sequence of values that define the gain arc may be calculated based on a mathematical function (e.g., a raised-cosine window or other function) and the gain ramp information.

In block 906, the gain arc (e.g., gain arc signal 594) is incorporated into the digital gain signal (e.g., digital gain signal 514) by combining the gain arc with an inverse ramp signal (e.g., digital inverse ramp signal 599). The inverse ramp signal may be a signal that is inversely related to the sequence of gains that will be applied by the SVGA to the portion of the RF signal, as discussed previously.

In block 908, the digital input signal (e.g., digital input signal 512) is received, and the digital gain signal is combined (e.g., by combiner 502) with a portion of the digital input signal to generate a pre-compensated digital signal (e.g., pre-compensated digital signal 516). A digital-to-analog conversion process is performed (e.g., by DAC block 504) to convert the pre-compensated digital signal into the analog domain, in block 910. The resulting pre-compensated analog signal (e.g., pre-compensated analog signal 518) is then upconverted (e.g., by RF modulator 506) to a carrier frequency, in block 912, in order to generate an RF signal (e.g., RF signal 520).

In block 914, a gain ramp signal (e.g., gain ramp signal 522) is generated, and SVGA gains are applied to the RF signal (e.g., by SVGA 508) based on the gain ramp signal in order to generate a gain-adjusted RF signal (e.g., gain-adjusted RF signal 524). As discussed previously, the gain ramp signal corresponds to the gain control signal received in block 902. Although the SVGA may abruptly transition the gains applied to the RF signal, adverse spectral effects that may otherwise be produced by the abrupt gain transitions are mitigated by the arc inherent in the digital gain signal that was applied to the digital input signal.

In block 916, the gain-adjusted RF signal (e.g., gain-adjusted RF signal 524) generated by the SVGA is amplified (e.g., by power amplifier 510) and transmitted over the air interface. The method may then iterate, as shown in FIG. 9, for subsequently received digital input signals.

It is to be understood that certain ones of the process blocks depicted in FIG. 9 may be performed in parallel with each other or with performing other processes. In addition, it is to be understood that the particular ordering of the process blocks depicted in FIG. 9 may be modified, while achieving substantially the same result. Accordingly, such modifications are intended to be included within the scope of the inventive subject matter.

Figure 10:
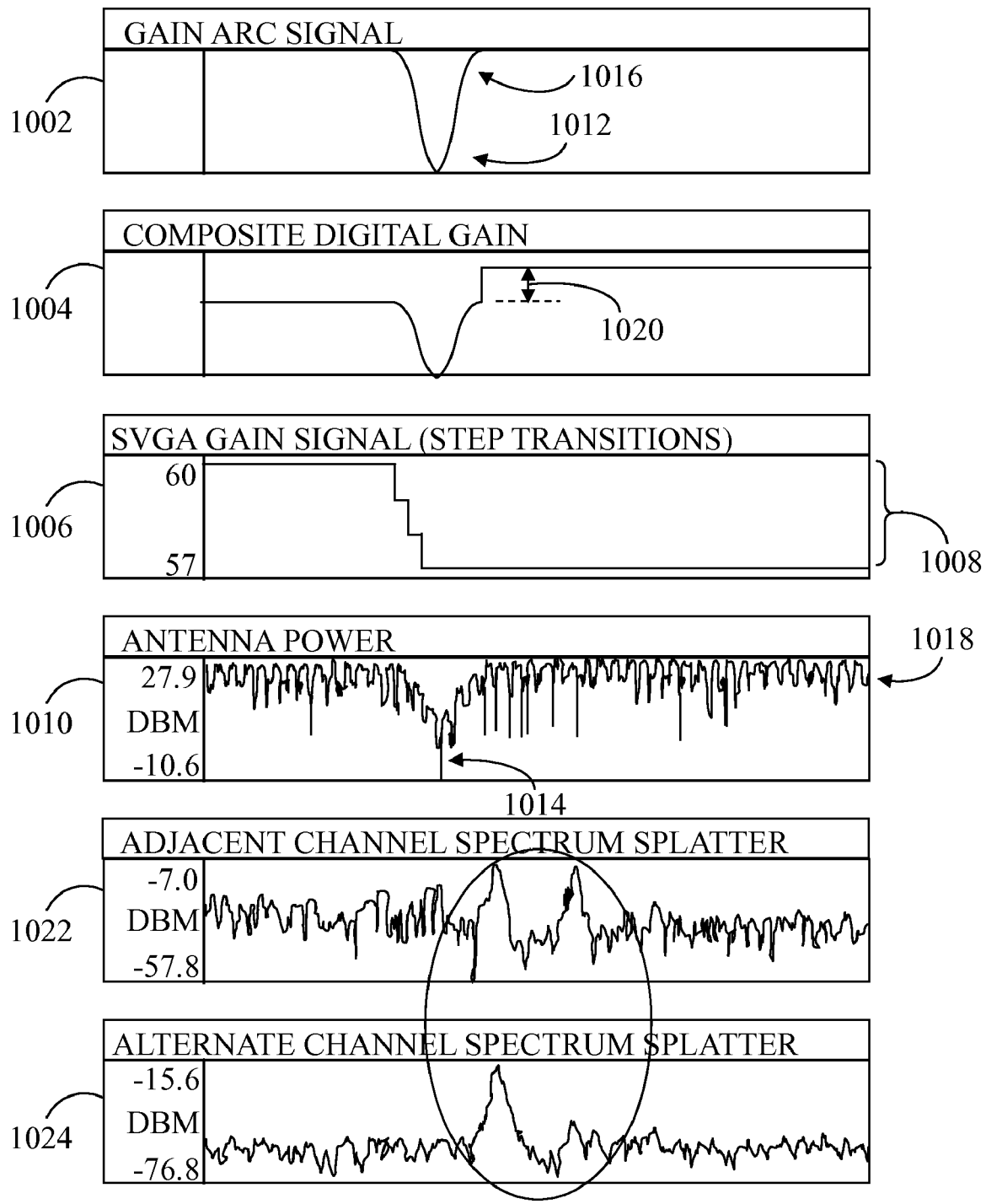
FIG. 10 illustrates time-domain representations of gain signals along with resulting antenna power, adjacent channel spectrum splatter, and alternate channel spectrum splatter.

FIG. 10 illustrates time-domain representations of gain signals along with resulting antenna power, adjacent channel spectrum splatter, and alternate channel spectrum splatter. More specifically, FIG. 10 illustrates a gain arc 1002 (e.g., gain arc signal 594, FIG. 5), a composite digital gain signal 1004 (e.g., digital gain 514), and an SVGA gain signal 1006. Gain arc 1002 may be combined with a digital representation of an inverse of the gain ramp signal (e.g., digital inverse ramp signal 599, FIG. 5) in order to generate a digital gain signal (e.g., digital gain signal 514, FIG. 5), referred to herein as composite digital gain signal 1004. Composite digital gain signal 1004 (e.g., digital gain 514) is subsequently combined with the digital input signal (e.g., digital input signal 512, FIG. 5). SVGA gain signal 1006 represents gain transitions that may be applied by an SVGA (e.g., SVGA 508, FIG. 5) in response to a gain ramp signal (e.g., gain ramp signal 522, FIG. 5). SVGA gain signal 1006 implements a step-down gain transition in three gain transition steps. That is a total gain transition 1008 is applied in three steps.

An antenna power signal 1010 (e.g., RF antenna output signal, FIG. 5) is produced in response to the application of composite digital gain signal 1004 and SVGA gain signal 1006 and is transmitted over the air interface via an antenna (e.g., antenna 106, FIG. 1). When digital gain signal 1004 is combined with digital input signal 512, antenna power signal 1010 decreases and increases in accordance with gain arc 1002. This is illustrated in FIG. 10 in which a bottom portion 1012 of gain arc 1002 corresponds to a low instantaneous power level 1014 of antenna power signal 1010 and an upper portion 1016 of gain arc 1002 corresponds to a higher target power level 1018. Composite digital gain signal 1004 exhibits a digital gain change 1020 that occurs during high target power level 1018. In addition, the application of SVGA gain level signal 1006 occurs at an onset of gain arc 1002, therefore also occurring during high target power level 1018.

The application of composite digital gain signal 1004, with digital gain change 1020, and SVGA gain level signal 1006 at an arbitrary time instant may cause ACLR degradation. That is, the gain changes imposed by digital gain signal 1004 and SVGA gain level signal 1006 can cause RF glitches at the antenna output which can result in significant degradation of the transient adjacent- or alternate-channel leakage ratio (ACLR). FIG. 10 provides an example of a peak spectrum splatter signal 1022 on an adjacent channel and a peak spectrum splatter signal 1024 on an alternate channel. Peak spectrum splatter signals 1022 and 1024 can result in reduced quality of service on the respective adjacent and alternate channels.

Figure 11:
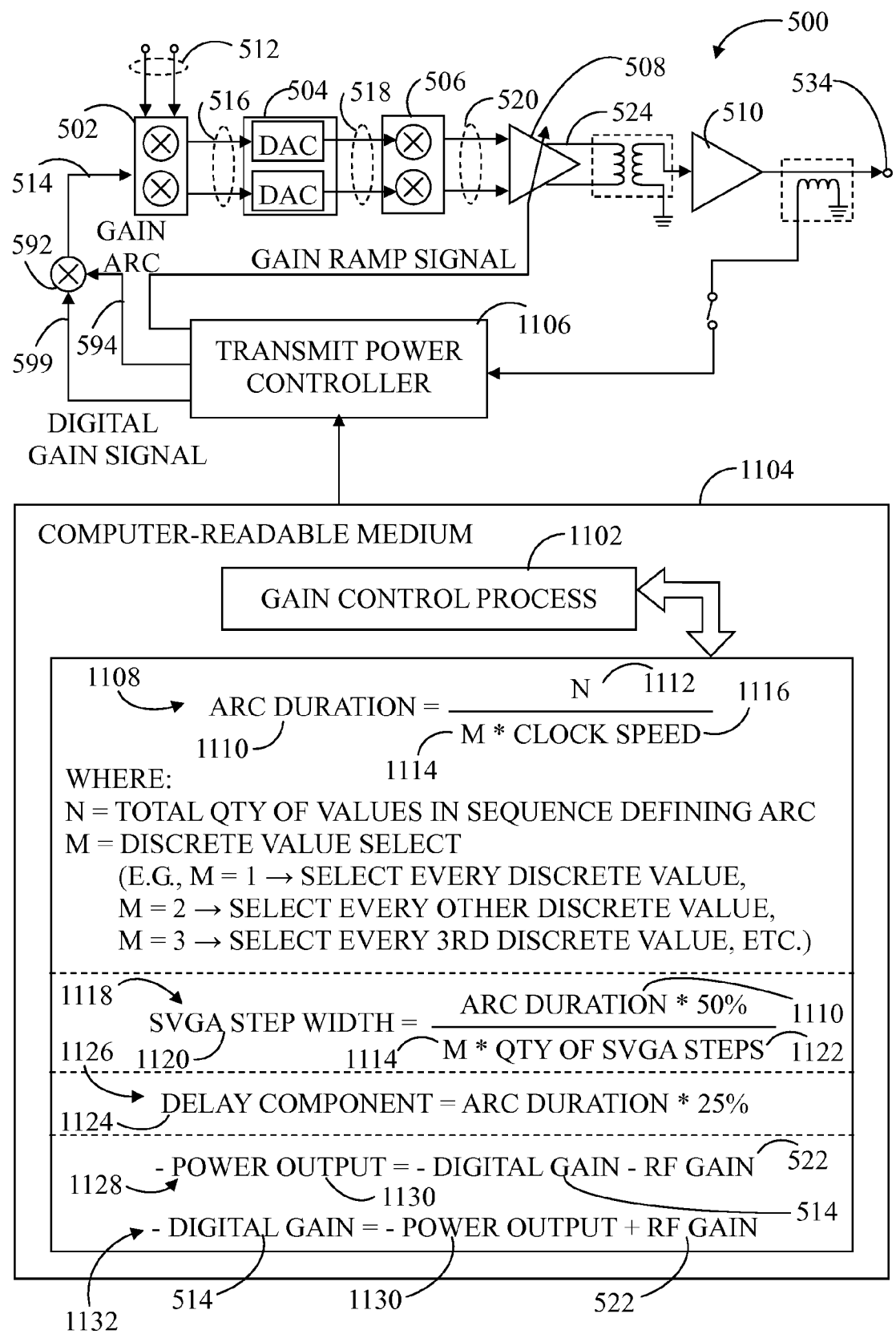
FIG. 11 illustrates a simplified block diagram of a portion of the RF transmitter, in accordance with another example embodiment.

FIG. 11 illustrates a simplified block diagram of a portion of RF transmitter 500, in accordance with another example embodiment. As discussed in detail above, transmitter 500 includes combiner 502, digital-to-analog converter (DAC) block 504, RF modulator 506, SVGA 508, and power amplifier 510. As further discussed above, transmitter 500 includes a feedback loop with associated elements for automatic gain control of transmitter 500. For example, transmitter 500 is adapted dynamically to adjust the gain of RF antenna output signal 532 (e.g., outgoing RF signal 136, FIG. 1), based on power control related commands received from other portions of the system (e.g., from processing subsystem 108, FIG. 1). In this embodiment, upon receipt of such a command, automatic gain control and timing is performed through the execution of firmware in the form of a gain control process 1102 contained in a computer-readable storage medium 1104 and executed by the elements in the feedback loop of transmitter 500, collectively referred to herein as a transmit power controller 1106. In general, firmware refers to coded instructions that are stored permanently in read-only memory (ROM). Thus, in an embodiment, computer-readable storage medium 1104 may be ROM. In alternate embodiments, computer-readable storage medium 1104 may be another volatile or non-volatile mass storage system executable by transmit power controller 1106. In still other embodiments, gain control process 1102 may be implemented as hardware.

Generally, gain control process 1102 provides the capability to perform ramping of instantaneous signal power while performing the discrete steps to improve system ACLR performance. ACLR is critical with high target power level 1018. Accordingly, gain control process 1102 provides a timing capability in order to exactly time the RF SVGA steps of SVGA gain level signal 1006 at low instantaneous signal power 1014. In order to exactly time the RF SVGA steps at low instantaneous power level 1014, system parameters such as SVGA start step, the end step, time of application of these RF steps, the width of the RF steps, and so forth are controlled dynamically depending on the amount of power change through the execution of gain control process 1102.

In addition, the transmit power changes of RF antenna output signal 532 can also be performed by stepping up or down composite digital gain 1004 (e.g., digital gain signal 514) to the desired value. Irrespective of large/small digital gain change, ACLR may be improved if these digital gain changes which lead to transmit power change happen at low instantaneous power level 1014. Accordingly, through the execution of gain control process 1102, the digital gain change value is calculated based on the amount of the power change and applied at low instantaneous signal power 1014.

Certain calculations, which may be embedded within gain control process 1102, are presented in FIG. 11 for clarity. An arc duration calculation 1108 may be employed to calculate an arc duration 1110 (e.g., arc duration 630, FIG. 6, and arc duration 730, FIG. 7). In this example, arc duration 1110 is equal to a total quantity of discrete values "N" 1112 (e.g., discrete values 634, FIG. 6, and discrete values 734, FIG. 7) in a sequence defining an arc, divided by a discrete value select factor "M" 1114 multiplied by a clock speed 1116. When the discrete value select factor 1114, M, is set to 1, every discrete value is selected. When M=2 every other discrete value is selected. When M=3 every third discrete value is selected, and so forth.

An SVGA step width calculation 1118 may be employed to calculate an SVGA step width 1120 of each of the steps of SVGA gain signal (e.g., SVGA gain level signal 602, FIG. 6, and SVGA gain level signal 702, FIG. 7). In this example, SVGA step width 1120 is equal to fifty percent of arc duration 1110 divided by the discrete value select factor 1114, M, multiplied by a total quantity of SVGA steps 1122 in the SVGA gain level signal.

In accordance with an embodiment, gain ramp signal 522 includes a delay component 1124 and a gain component. Delay component 1124 is incorporated into gain ramp signal 522 to provide the precise timing called for so that the gain component of gain ramp signal 522 in the form of SVGA gain signal (e.g., SVGA gain level signal 602, FIG. 6, and SVGA gain level signal 702, FIG. 7) is applied to RF signal 520 at the appropriate time, and more specifically, during low instantaneous signal power level 1014. In one embodiment, a delay component calculation 1126 computes delay component 1124 as substantially twenty-five percent of arc duration 1110. In other embodiments, however, less than twenty-five percent or more than twenty-five percent of arc duration 1110 may alternatively be computed.

A power output calculation 1128 represents output power 1130 of gain-adjusted RF signal 524 (FIG. 5) as a function of digital gain 514 and gain ramp signal 522. Based upon power control related commands and internal tables, output power 1130 and gain ramp signal 522 are known. Accordingly, power output calculation 1128 can be readily adjusted into a digital gain calculation 1132 so that digital gain 514 can be calculated in response to the known output power 1130 and gain ramp signal 522.

Figure 12:
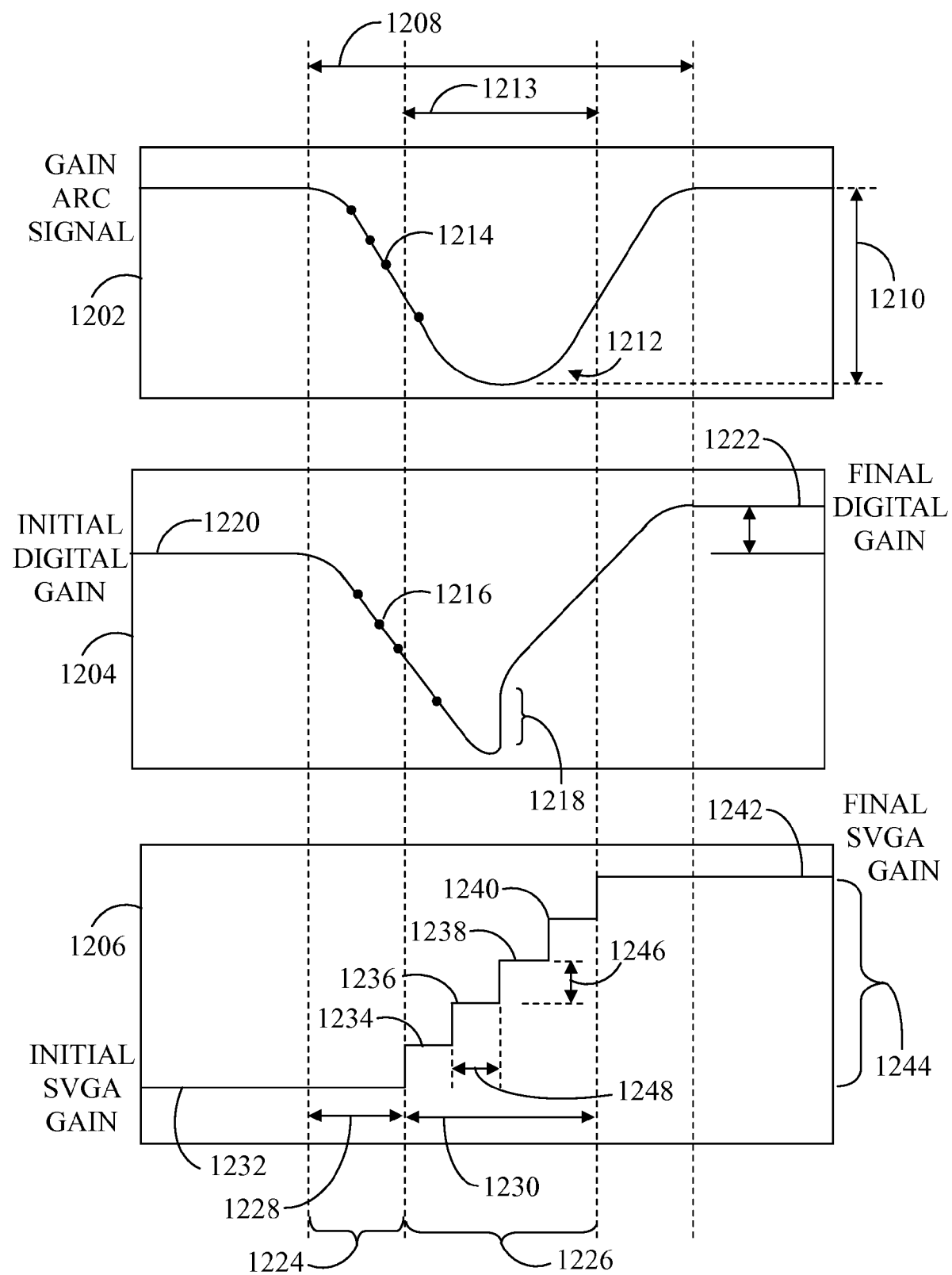
FIG. 12 illustrates time-domain representations of a gain arc signal, a composite digital gain signal, and SVGA gain level signal, in accordance with the example embodiment of FIG. 11.

FIG. 12 illustrates time-domain representations of a gain arc signal 1202 (e.g., gain arc signal 594, FIG. 5), a composite digital gain signal 1204 (e.g., digital gain signal 514, FIG. 5), and a SVGA gain level signal 1206, in accordance with the example embodiment of FIG. 11. SVGA gain level signal 1206 represents a gain transition that may be applied by an SVGA (e.g., SVGA 508, FIG. 5) in response to a gain ramp signal (e.g. gain ramp signal 522, FIG. 5).

Gain arc signal 1202 may be generated through the execution of gain control process 1102 based on information (e.g., gain ramp information 597, FIG. 5) that describes a gain transition that will be applied by the SVGA (e.g., SVGA 508, FIG. 5). Gain arc signal 1202 is characterized by an arc duration 1208 (e.g., arc duration 1110, FIG. 11) and an arc depth 1210. A portion 1212 of gain arc signal 1202 indicates low instantaneous power level at the transmitter antenna (e.g., antenna 106, FIG. 1). In this example, portion 1212 is characterized by a period 1213 that is approximately fifty percent of arc duration 1208 and is centered at the bottom of gain arc signal 1202. In other embodiments, however, less than fifty percent or more than fifty percent of arc duration 1208 may alternatively be computed. As discussed in detail above, arc duration 1208 and arc depth 1210 may be fixed or variable. Discrete values 1214 defining gain arc signal 1210 may be generated as discussed in detail above.

In this example, gain arc signal 1202 is combined with a digital representation of an inverse of the gain ramp signal (e.g., digital inverse ramp signal 599, FIG. 5) in order to generate composite digital gain signal 1204 (e.g., digital gain signal 514). As such, discrete values 1216 correspond to a combination of gain arc signal 1202 with a digital signal that is related to SVGA gain level signal 1206. In accordance with the embodiment of FIG. 11, a digital gain change 1218 is applied through the execution of gain control process 1102 (FIG. 11) to adjust digital gain signal 1204 from an initial digital gain 1220 to a final digital gain 1222. This digital gain change 1218 is applied at the lowest instantaneous power level at the transmitter antenna as indicated by portion 1212 of gain arc signal 1210. Application of digital gain change 1218 at the lowest instantaneous power level can improve ACLR performance.

In this example, SVGA gain level signal 1206 is generated through the execution of gain control process 1102. SVGA gain level signal 1206 includes a delay component 1224 (e.g., delay component 1124, FIG. 11) and a gain component 1226. As discussed above, delay component 1224 may have a duration 1228 that is substantially twenty-five percent of arc duration 1208, and gain component 1226 may have a duration 1230 that is substantially fifty percent of arc duration 1208.

Gain component 1226 illustrates gain transitions that may be represented by a sequence of codes, i.e., gains, conveyed in a gain ramp signal (e.g., gain ramp signal 522, FIG. 5). For example, for gain component 1226 of SVGA gain level signal 1206, a first code may represent an initial SVGA gain level 1232. A second code may represent a gain step 1234, a third code may represent a gain step 1236, a fourth code may represent a gain step 1238, a fifth code may represent a gain step 1240, and a sixth code may represent a final SVGA gain step 1242. The difference between initial SVGA gain level 1232 and final SVGA gain step 1242 defines a gain transition 1244, and the transition time period during which gain transition 1244 is to be achieved is duration 1230 (e.g., substantially fifty percent of arc duration 1208). For illustrative purposes, gain steps 1234, 1236, 1238, 1240, and 1242 are shown stepping upward, i.e., increasing. However, it should be understood that the gain steps of gain level signal 1206 may alternatively step down, as discussed in connection with FIGS. 6 and 7.

Although this example illustrates five steps, as discussed above, SVGA gain level signal 1206 may be implemented in any number of steps. The desired gain transition and the selected number of steps govern a step height 1246 (i.e., increase or decrease) for each of steps 1234, 1236, 1238, 1240, and 1242. In addition, a step width 1248 for each of gain steps 1234, 1236, 1238, and 1240 may be computed using SVGA step width calculation 1118 (FIG. 11) during execution of gain control process 1102 (FIG. 11).

In an example, application of SVGA gain level signal 1206 occurs at an onset of arc duration 1208 with the application of delay component 1224 for the initial twenty-five percent of arc duration 1208 followed by the application of gain component 1226 for a subsequent fifty percent of arc duration 1208. Accordingly, application of the sequence of gains, e.g., from initial SVGA gain level 1232, through gain steps 1234, 1236, 1238, 1240, and final SVGA gain step 1242, occur when portion 1212 of gain arc signal 1202 indicates the low instantaneous signal power. Since stepping the gain of the SVGA (e.g., SVGA 508, FIG. 5) causes RF glitches at the antenna output (e.g., RF antenna output signal 532, FIG. 5), timing the gain transition 1244 to occur during portion 1212 of gain arc signal 1202 ensures that the RF gain steps happen a lower power levels so as to reduce undesirable ACLR degradation.

Figure 13:
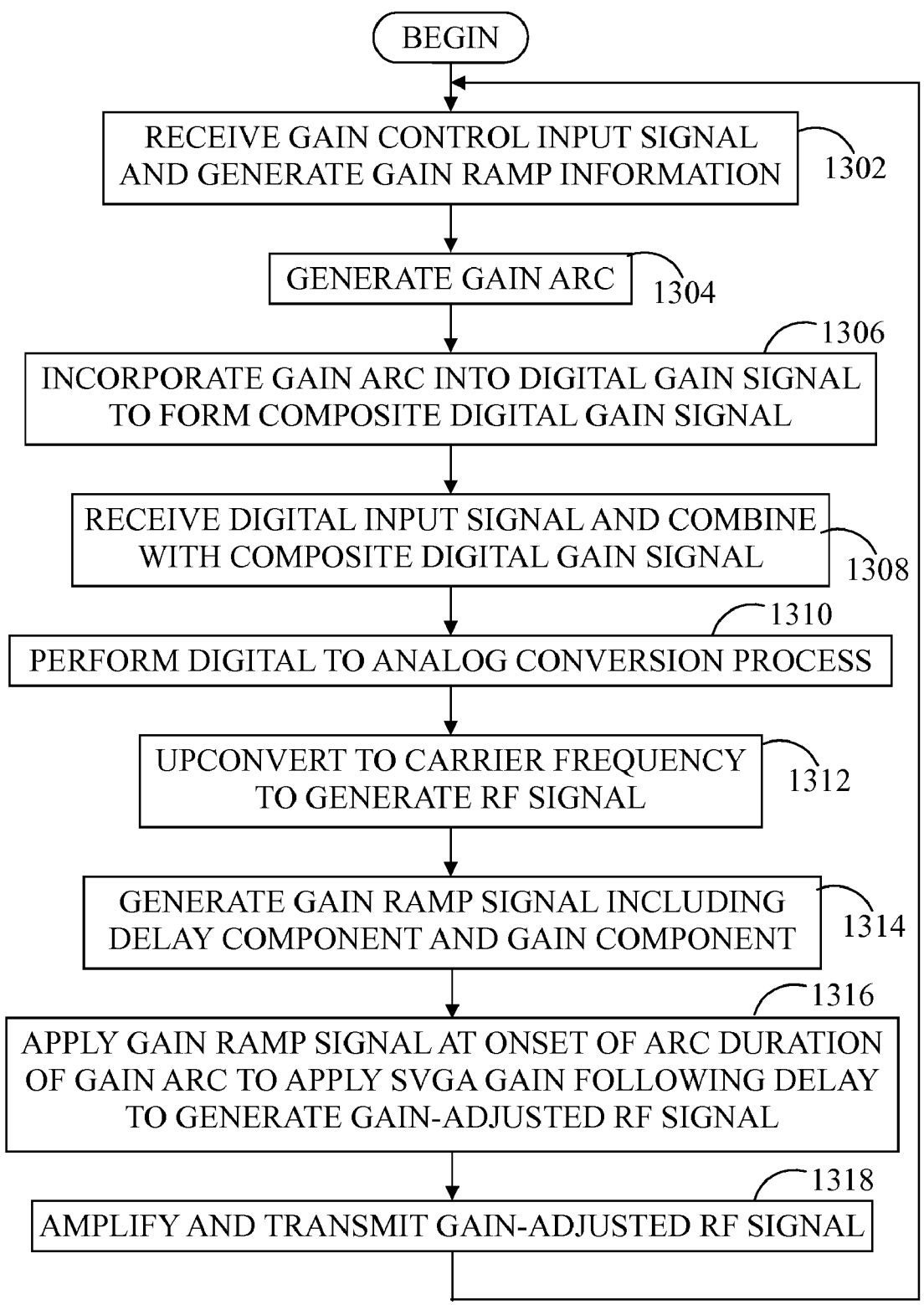
FIG. 13 illustrates a flowchart of a method for automatically performing gain control, in accordance with another example embodiment.

FIG. 13 illustrates a flowchart of a method for automatically performing gain control, in accordance with another example embodiment. In particular, the flowchart provides an illustration of gain control process 1102 (FIG. 11) executed by transmit power controller 1106 (FIG. 11) of transmitter 500.

Referring also to FIGS. 5, 11, and 12, the method may begin, in a block 1302, when a gain control input signal (e.g., gain control input signal 528) is received. For example, a gain control input signal may be a signal that indicates a system-determined gain that is to be applied by an SVGA (e.g., SVGA 508) to a portion of an RF signal (e.g., RF signal 520). In an embodiment, gain ramp information (e.g., gain ramp information 597) is generated (e.g., by SVGA ramp generator 526) based on the gain control input signal. The gain ramp information may indicate the gain or gain transition 1244 that will be commanded to SVGA 508 for application to an upcoming portion of RF signal 520.

Next in a block 1304, a gain arc 1202 is generated based on the gain ramp information, or more specifically, based on characteristics of the gain transition 1244 that will be applied by SVGA 508 to the portion of the RF signal 520. In an embodiment, gain arc 1202 is generated by a gain arc generator (e.g., gain arc generator 596). Gain arc 1202 includes sequence of values 1214 that define an arc, as discussed in detail previously. Gain arc 1202 may be generated, in an embodiment, by retrieving gain arc data (e.g., a sequence of gain magnitude values) and/or parameters (e.g., arc depth, arc duration) defining the gain arc from a gain arc table. In an alternate embodiment, the sequence of values that define gain arc 1202 may be calculated based on a mathematical function (e.g., a raised-cosine window or other function) and the gain ramp information.

Next in a block 1306, gain arc signal 1202 is combined with a digital gain signal (e.g., digital inverse ramp signal 599) to form composite digital gain signal 1204 (e.g., digital gain signal 514) having digital gain change 1218.

Next in a block 1308, the digital input signal (e.g., digital input signal 512) is received, and composite digital gain signal 514 is combined (e.g., by combiner 502) with a portion of digital input signal 512 to generate a pre-compensated digital signal (e.g., pre-compensated digital signal 516). Although composite digital gain signal 514 may abruptly transition through the application of digital gain change 1218, adverse spectral effects that may otherwise be produced by the abrupt digital gain change 1218 are mitigated by the application of digital gain change 1218 during period 1213 of low instantaneous signal power.

A digital-to-analog conversion process is performed (e.g., by DAC block 504) to convert pre-compensated digital signal 516 into the analog domain, in block 1310. The resulting pre-compensated analog signal (e.g., pre-compensated analog signal 518) is then upconverted (e.g., by RF modulator 506) to a carrier frequency, in block 1312, in order to generate an RF signal (e.g., RF signal 520), also referred to herein as a pre-adjusted analog signal 520.

In a block 1314, a gain ramp signal 1206 (e.g., gain ramp signal 522) is generated to include delay component 1224 and gain component 1226 indicating the sequence of gains (e.g., initial SVGA gain level 1232, gain steps 1234, 1236, 1238, 1240, and final SVGA gain step 1242) for gain transition 1244.

Next in a block 1316, delay component 1224 and gain component 1226 are applied to pre-adjusted analog signal 520 by SVGA 508. In particular, delay component 1224 is initially imposed at an onset of arc duration 1208 to delay the application of gain component 1226 until portion 1212 of arc duration 1208 indicating low instantaneous power level. During period 1213 of low instantaneous signal power, gain steps 1234, 1236, 1238, 1240, and final SVGA gain step 1242 are applied to pre-adjusted analog signal 520 based on gain ramp signal 522 in order to generate a gain-adjusted RF signal (e.g., gain-adjusted RF signal 524). As discussed previously, gain ramp signal 522 corresponds to gain control input signal 528 received in block 1302. Although the SVGA may abruptly transition the gains applied to the RF signal, adverse spectral effects that may otherwise be produced by the abrupt gain transitions are mitigated by their application during period 1213 of low instantaneous power level. Furthermore, adverse spectral effects of digital gain change 1218 in composite digital gain signal 1204 are mitigated by its application during period 1213 of low instantaneous power level.

In block 1318, the gain-adjusted RF signal (e.g., gain-adjusted RF signal 524) generated by SVGA 508 is amplified (e.g., by power amplifier 510) and transmitted over the air interface. The method may then iterate, as shown in FIG. 13, for subsequently received digital input signals. Of course, it is to be understood that certain ones of the process blocks depicted in FIG. 13 may be performed in parallel with each other or with performing other processes. In addition, it is to be understood that the particular ordering of the process blocks depicted in FIG. 13 may be modified, while achieving substantially the same result. Accordingly, such modifications are intended to be included within the scope of the inventive subject matter.

Figure 14:
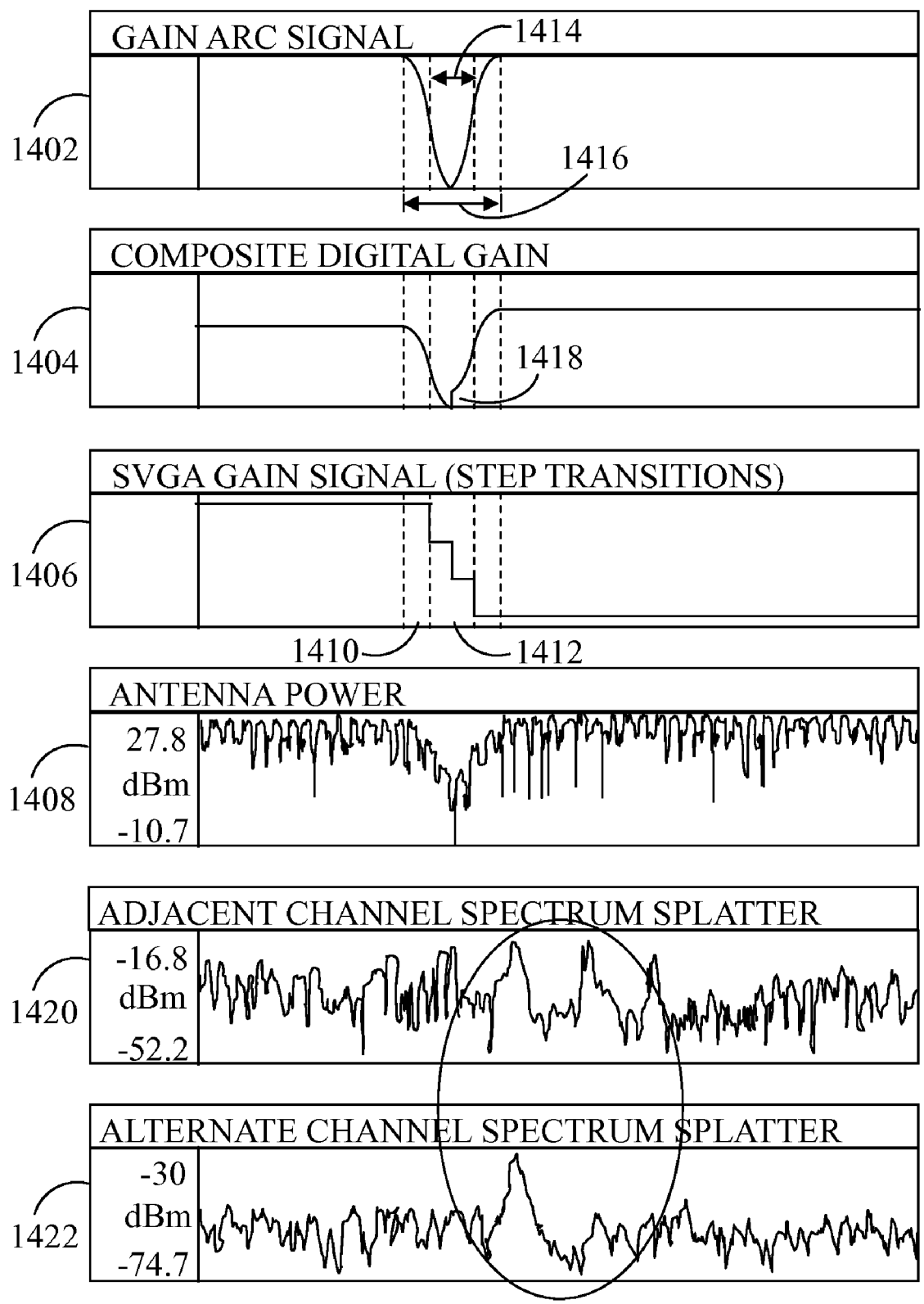
FIG. 14 illustrates time-domain representations of gain signals along with resulting antenna power, adjacent channel spectrum splatter, and alternate channel spectrum splatter in accordance with the method of FIG. 13.

FIG. 14 illustrates time-domain representations of gain signals along with resulting antenna power, adjacent channel spectrum splatter, and alternate channel spectrum splatter in accordance with the method of FIG. 13. More specifically, FIG. 14 illustrates a gain arc signal 1402 (e.g., gain arc signal 594, FIG. 5), a composite digital gain signal 1404 (e.g., digital gain 514), and an SVGA gain signal 1406. An antenna power signal 1408 (e.g., RF antenna output signal, FIG. 5) is produced in response to the application of composite digital gain signal 1404 and SVGA gain signal 1406 and is transmitted over the air interface via an antenna (e.g., antenna 106, FIG. 1). As illustrated in FIG. 14, application of a delay component 1410 (e.g. delay component 1224, FIG. 12) followed by a gain component 1412 (e.g., gain component 1226, FIG. 12) causes gain component 1412 to be applied during a period 1414 (e.g., period 1213, FIG. 12) of low instantaneous power, i.e., during the central fifty percent of an arc duration 1416 (e.g., arc duration 1208, FIG. 12) of gain arc signal 1402. In addition, a digital gain change 1418 within composite digital gain signal 1404 further occurs during period 1414 of low instantaneous signal power.

Application of composite digital gain signal 1404 and SVGA gain signal 1406 during period 1414 of low instantaneous signal power yields improvements in ACLR. FIG. 14 provides an example of a peak spectrum splatter signal 1420 on an adjacent channel and a peak spectrum splatter signal 1422 on an alternate channel. In an example, peak spectrum splatter signal 1420 may yield an approximate ten decibel improvement in system ACLR, and peak spectrum splatter signal 1422 may yield an approximate fifteen decibel improvement in ACLR.

Thus, various embodiments of gain control methods and apparatus for wireless devices and transmitters have been described. A particular embodiment includes a transmitter of a wireless device, which includes a ramp generator, a digital gain signal generator, a combiner, and a variable gain amplifier. The ramp generator is adapted to receive a gain control input signal and to generate a gain ramp signal based on the gain control input signal, where the gain ramp signal indicates a sequence of gains. The digital gain signal generator is adapted to generate and incorporate a gain arc into a digital gain signal, where the gain arc includes a sequence of digital values that defines an arc, and where the sequence of digital values is related to the sequence of gains. The combiner is adapted to receive a digital input signal and the digital gain signal, and to combine the digital gain signal with the digital input signal to generate a pre-compensated digital signal. The variable gain amplifier is adapted to apply the gains indicated in the gain ramp signal to a pre-adjusted analog signal in order to generate a gain-adjusted analog signal, where the pre-adjusted analog signal is generated from the pre-compensated digital signal.

Another embodiment includes a wireless device, which includes a processing subsystem adapted to generate an outgoing digital signal, a transmitter adapted to generate a gain-adjusted analog signal based on the outgoing digital signal, a power amplifier adapted to receive and amplify the gain-adjusted analog signal in order to generate an antenna output signal, and an antenna adapted to receive the antenna output signal and to transmit the antenna output signal over an air interface. The transmitter includes a ramp generator, a digital gain signal generator, a combiner, and a variable gain amplifier. The ramp generator is adapted to receive a gain control input signal and to generate a gain ramp signal based on the gain control, input signal, where the gain ramp signal indicates a sequence of gains. The digital gain signal generator is adapted to generate and incorporate a gain arc into a digital gain signal, where the gain arc includes a sequence of digital values that defines an arc, and where the sequence of digital values is related to the sequence of gains. The combiner is adapted to receive the outgoing digital signal and the digital gain signal, and to combine the digital gain signal with the outgoing digital signal to generate a pre-compensated digital signal. The variable gain amplifier is adapted to apply the gains indicated in the gain ramp signal to a pre-adjusted analog signal in order to generate a gain-adjusted analog signal, where the pre-adjusted analog signal is generated from the pre-compensated digital signal.

Yet another embodiment includes a method for performing automatic gain control in a wireless device. The method includes the steps of receiving a gain control input signal and generating a gain ramp signal based on the gain control input signal, where the gain ramp signal indicates a sequence of gains. The method also includes generating a gain arc that includes a sequence of digital values that defines an arc, where the sequence of digital values is related to the sequence of gains, and incorporating the gain arc into the digital gain signal. The method also includes receiving a digital input signal, combining the digital gain signal with the digital input signal to generate a pre-compensated digital signal, generating a pre-adjusted analog signal from the pre-compensated digital signal, and applying the gains indicated in the gain ramp signal to the pre-adjusted analog signal to generate a gain-adjusted analog signal.

In another embodiment, the method for performing automatic gain control generates a gain ramp signal that includes a delay component and a gain component. When the gain ramp signal is applied to the pre-adjusted analog signal at the variable gain amplifier, the applying operation occurs at an onset of the arc duration of a gain arc with an application of the delay component followed by the gain component such that application of the sequence of gains to the pre-adjusted signal occurs when the gain arc indicates a low instantaneous signal power at the antenna of the transmitter. In addition, a digital gain change imposed upon the digital gain signal occurs when the gain arc indicates low instantaneous signal power.

Embodiments may provide one or more of several advantages over traditional transmitter apparatus and methods. For example, as discussed previously, by smoothing otherwise abrupt gain transitions in the time domain, out-of-band sidelobe levels may be reduced in the frequency domain. Alternatively, by aligning gain transitions (SVGA RF steps and the digital gain change) at the lowest instantaneous power level, out-of-band sidelobe levels may also be reduced in the frequency domain. In either instance, this, in turn, may result in an improved ACLR and/or BER. The lower out-of-band sidelobe levels may result in a reduction in or elimination of adjacent and alternate channel interference. In addition, an SVGA and the circuitry for generating the gain arcs may be fabricated on a CMOS die, rather than including a variable gain amplifier on a single die, as is done in traditional transmitters. Accordingly, the SVGA may be fabricated on the same integrated circuit chip as the power amplifier, which also may be fabricated on a CMOS die. Alternatively, the SVGA and power amplifier may be fabricated on separate dies, albeit of the same type, and the two dies may be packaged within the same device package. Accordingly, the SVGA/power amplifier combination may be included within a single device package. This may reduce the area allocated for the variable gain amplifier and power amplifier circuitry, and may thus facilitate the design of smaller transmitters and/or smaller devices.

Embodiments described above have discussed signal processing based on values represented in Cartesian coordinates. Accordingly, digital signal processing carried out by the system may be performed using techniques appropriate for Cartesian coordinate calculations. In other embodiments, some values may be represented in polar coordinates or using other representations. It is to be understood that the scope of the inventive subject matter is intended to include embodiments in which digital signal processing carried out by the system may be performed using techniques appropriate for polar coordinate calculations or other types of calculations. Embodiments of the inventive subject matter may include other modifications, as well.

While the principles of the inventive subject matter have been described above in connection with specific systems, apparatus, and methods, it is to be clearly understood that this description is made only by way of example and not as a limitation on the scope of the inventive subject matter. Further, the phraseology or terminology employed herein is for the purpose of description and not of limitation.

The foregoing description of specific embodiments reveals the general nature of the inventive subject matter sufficiently that others can, by applying current knowledge, readily modify and/or adapt it for various applications without departing from the general concept. Therefore, such adaptations and modifications are within the meaning and range of equivalents of the disclosed embodiments. The inventive subject matter embraces all such alternatives, modifications, equivalents, and variations as fall within the spirit and broad scope of the appended claims.

What is claimed is:

1. A method for performing gain control in a transmitter of a wireless device, said transmitter including a combiner and a variable gain amplifier, said method comprising:
generating a gain ramp signal that includes a delay component and a gain component, said gain component indicating a sequence of gains;
generating a gain arc, said gain arc exhibiting an arc duration, and a portion of said gain arc indicating a low instantaneous signal power level at an antenna of said wireless device;
incorporating said gain arc into a digital gain signal to form a composite digital gain signal;
receiving a digital input signal at said combiner;
combining said composite digital gain signal with said digital input signal at said combiner to generate a pre-compensated digital signal;
generating a pre-adjusted analog signal from said pre-compensated digital signal; and
applying said gain ramp signal to said pre-adjusted analog signal at said variable gain amplifier to generate a gain-adjusted analog signal for transmission from said wireless device, said applying operation occurring at an onset of said arc duration with an application of said delay component followed by said gain component such that application of said sequence of gains to said pre-adjusted analog signal occurs when said gain arc indicates said low instantaneous signal power.

2. A method as claimed in claim 1 wherein said generating said gain ramp signal comprises:
determining a gain transition for said gain component to be applied by said variable gain amplifier, said gain transition indicating an initial gain of said pre-adjusted analog signal and a final gain of said pre-adjusted analog signal; and
establishing a transition time period for said gain transition based on a time period for said portion of said gain arc indicating said low instantaneous signal power.

3. A method as claimed in claim 2 wherein said establishing operation establishes said transition time period as substantially equivalent to said time period for said portion of said gain arc that indicates said low instantaneous signal power level.

4. A method as claimed in claim 3 wherein each of said time period and said transition time period are substantially fifty percent of said arc duration.

5. A method as claimed in claim 1 wherein said variable gain amplifier is a stepped variable gain amplifier, said gains from said sequence of gains are applied as stepped gain transitions, and said generating said gain ramp signal comprises determining a step duration of each of said gains in response to a time period for said portion of said gain arc that indicates said low instantaneous signal power level.

6. A method as claimed in claim 1 wherein said generating said gain ramp signal includes establishing said delay component in response to said arc duration.

7. A method as claimed in claim 6 wherein said delay component is substantially twenty-five percent of said arc duration.

8. A method as claimed in claim 1 wherein said generating said gain arc comprises:
determining a gain transition for said gain component to be applied by said variable gain amplifier, said gain transition indicating an initial gain of said pre-adjusted analog signal and a final gain of said pre-adjusted analog signal; and
generating said gain arc as a sequence of digital values related to said sequence of gains of said gain component to be applied to achieve said gain transition.

9. A method as claimed in claim 1 wherein said generating said gain arc comprises generating said gain arc as a sequence of digital values calculated based on said arc duration and an arc depth.

10. A method as claimed in claim 1 wherein said generating said gain ramp signal comprises:
determining a digital gain change for said composite digital gain change; and
enabling said digital gain change to occur when said portion of said gain arc indicates said low instantaneous signal power.

11. A method as claimed in claim 1 wherein said transmitter further comprises a digital-to-analog conversion (DAC) block and a radio frequency (RF) modulator interposed between said combiner and said variable gain amplifier, and said method further comprises:
converting said pre-compensated digital signal into a pre-compensated analog signal by performing a digital-to-analog conversion process at said DAC block; and
modulating said pre-compensated analog signal to a radio frequency carrier frequency to generate said pre-adjusted analog signal.

12. A method as claimed in claim 1 where said transmitter further comprises a power amplifier interposed between said variable gain amplifier and said antenna, and said method further comprises:
receiving said gain-adjusted analog signal at said power amplifier from said variable gain amplifier;
amplifying said gain-adjusted analog signal at said power amplifier to generate an antenna output signal;
receiving said antenna output signal at said antenna from said power amplifier; and
transmitting said antenna output signal from said antenna over an air interface.

13. A transmitter of a wireless device comprising:
a controller adapted to generate a gain ramp signal that includes a delay component and a gain component, said gain component indicating a sequence of gains, said controller further being adapted to generate and incorporate a gain arc into a digital gain signal to form a composite digital gain signal, said gain arc including a sequence of digital values that defines an arc, said gain arc exhibiting an arc duration, and a portion of said gain arc indicating a low instantaneous signal power level at an antenna of said wireless device;
a combiner adapted to receive a digital input signal and said composite digital gain signal, and to combine said composite digital gain signal with said digital input signal to generate a pre-compensated digital signal; and
a variable gain amplifier adapted to apply said gain ramp signal to a pre-adjusted analog signal in order to generate a gain-adjusted analog signal, said pre-adjusted analog signal being generated from said pre-compensated digital signal, said gain ramp signal being applied at an onset of said arc duration with an application of said delay component followed by said gain component such that application of said sequence of gains to said pre-adjusted analog signal occurs when said gain arc indicates said low instantaneous signal power level.

14. A transmitter as claimed in claim 13 wherein said controller is adapted to generate said delay component based on said arc duration.

15. A transmitter as claimed in claim 13 wherein said controller is adapted to determine a gain transition for said gain component to be applied by said variable gain amplifier, said gain transition indicating an initial gain of said pre-adjusted analog signal and a final gain of said pre-adjusted analog signal, and establish a transition time period for said gain transition as being substantially equivalent to a time period for said portion of said gain arc that indicates said low instantaneous signal power level.

16. A transmitter as claimed in claim 13 wherein said controller is adapted to determine a digital gain change for said composite digital gain signal and enable said digital gain change to occur when said portion of said gain arc indicates said low instantaneous signal power.

17. A computer-readable storage medium containing executable code for instructing a controller to perform gain control in a transmitter of a wireless device, said transmitter including a combiner and a variable gain amplifier, said combiner receiving a digital input signal, and said variable gain amplifier receiving a pre-adjusted analog signal derived from said digital input signal, and said executable code instructing said controller to perform operations comprising:

receiving a gain control input signal that identifies a gain transition for a gain component to be applied to said pre-adjusted analog signal by said variable gain amplifier, said gain transition indicating an initial gain of said pre-adjusted analog signal and a final gain of said pre-adjusted analog signal;

generating a gain arc related to said gain transition, said gain arc exhibiting an arc duration, and a portion of said gain arc indicating a low instantaneous signal power at an antenna of said wireless device;

generating a gain ramp signal that includes a delay component and a gain component, said gain component indicating a sequence of gains for achieving said gain transition, said generating said gain ramp signal including establishing said delay component in response to said arc duration and establishing a transition time period for said gain component based on a time period for said portion of said gain arc that indicates said low instantaneous signal power;

incorporating said gain arc into a digital gain signal to form a composite digital gain signal having a digital gain change;

providing said composite digital gain signal to said combiner for combination with said digital input signal to generate a pre-compensated digital signal such that said digital gain change occurs when said portion of said gain arc indicates said low instantaneous signal power; and providing said gain ramp signal to said variable gain amplifier for combination with said pre-adjusted analog signal to generate a gain-adjusted analog signal for transmission from said antenna, said providing operation occurring at an onset of said arc duration with an application of said delay component followed by said gain component such that application of said sequence of gains to said pre-adjusted analog signal occurs when said portion of said gain arc indicates said low instantaneous signal power.

18. A computer-readable storage medium as claimed in claim 17 wherein said executable code instructs said controller to define a transition time period for achieving said gain transition as being substantially equivalent to fifty percent of said arc duration.

19. A computer-readable storage medium as claimed in claim 17 wherein said variable gain amplifier is a stepped variable gain amplifier, said gains from said sequence of gains are applied as stepped gain transitions, and said executable code instructs said controller to determine a step duration of each of said gains in response to a time period for said portion of said gain arc that indicates said low instantaneous signal power level.

20. A computer-readable storage medium as claimed in claim 17 wherein said executable code instructs said controller to define said delay component as being substantially equivalent to twenty-five percent of said arc duration.

* * * * *